US008878709B2

(12) United States Patent
Hyodo et al.

(10) Patent No.: US 8,878,709 B2
(45) Date of Patent: Nov. 4, 2014

(54) SEMICONDUCTOR INTEGRATED CIRCUIT AND LIQUID CRYSTAL DRIVE CIRCUIT

(75) Inventors: Kenji Hyodo, Kagoshima (JP); Takashi Ichirizuka, Kagoshima (JP); Takuya Kimoto, Kagoshima (JP); Minoru Togo, Kagoshima (JP)

(73) Assignee: Sony Corporation, Tokyo (JP)

( * ) Notice: Subject to any disclaimer, the term of this patent is extended or adjusted under 35 U.S.C. 154(b) by 1177 days.

(21) Appl. No.: 12/801,592

(22) Filed: Jun. 16, 2010

(65) Prior Publication Data

US 2011/0001765 A1 Jan. 6, 2011

(30) Foreign Application Priority Data

Jul. 2, 2009 (JP) ................................ 2009-158067

(51) Int. Cl.
*H03M 1/00* (2006.01)
*G09G 3/36* (2006.01)

(52) U.S. Cl.
CPC ........ *G09G 3/3688* (2013.01); *G09G 2310/027* (2013.01)
USPC .......................................... 341/141; 341/144

(58) Field of Classification Search
USPC ................................ 341/141, 144, 120, 118
See application file for complete search history.

(56) References Cited

U.S. PATENT DOCUMENTS

| | | | | |
|---|---|---|---|---|
| 5,198,814 | A * | 3/1993 | Ogawara et al. | 341/118 |
| 5,955,979 | A * | 9/1999 | Knudsen | 341/118 |
| 7,925,943 | B2 * | 4/2011 | Whetsel | 714/727 |
| 8,416,171 | B2 * | 4/2013 | Murahashi et al. | 345/93 |

FOREIGN PATENT DOCUMENTS

| | | |
|---|---|---|
| JP | 06-208346 | 7/1994 |
| JP | 08-050796 | 2/1996 |
| JP | 08-184804 | 7/1996 |
| JP | 08-278771 | 10/1996 |
| JP | 09-015557 | 1/1997 |
| JP | 10-105122 | 4/1998 |
| JP | 2005-331709 A | 12/2005 |
| JP | 2007-147959 A | 6/2007 |
| JP | 2009-104106 A | 5/2009 |

OTHER PUBLICATIONS

Japanese Office Action issued Jun. 11, 2013 for corresponding Japanese Application No. 2009-158067.

* cited by examiner

*Primary Examiner* — Brian Young

(74) *Attorney, Agent, or Firm* — Rader, Fishman & Grauer PLLC

(57) ABSTRACT

Disclosed herein is a semiconductor integrated circuit including: line buffers; an alpha channel first selector; an alpha channel digital-to-analog converter; a beta channel digital-to-analog converter; a redundant digital-to-analog converter; an alpha channel second selector; a beta channel second selector; an alpha channel amplifier; and a beta channel amplifier.

19 Claims, 12 Drawing Sheets

SEMICONDUCTOR INTEGRATED CIRCUIT AND LIQUID CRYSTAL DRIVE CIRCUIT

BACKGROUND OF THE INVENTION

1. Field of the Invention

The present invention relates to a semiconductor integrated circuit or liquid crystal drive circuit incorporating a plurality of D/A (digital-to-analog) converters with a redundant circuit.

2. Description of the Related Art

Semiconductor integrated circuits having a number of D/A converters formed parallel to each other on a semiconductor substrate are popular in a number of fields. In a liquid crystal panel for a liquid crystal display, for example, pixels are formed each at one of the intersections between a number of scan lines and a number of signal lines so that scan and image signals are applied respectively to the scan and signal lines to drive the pixels (refer, for example, to Japanese Patent Laid-Open No. Hei 8-50796). FIG. 14 is a schematic diagram illustrating a D/A converter 100 of a signal driver adapted to supply image signals to the liquid crystal panel. A logic circuit 120 supplies serial data for image display to line buffers 131 to 139 that are connected in series. The line buffers 131 to 139 convert input serial data into parallel data for respective channels. Each of D/A converters 141 to 149 converts digital data for one of the channels into analog data and outputs the analog data to one of amplifiers 151 to 159. Each of the amplifiers 151 to 159 amplifies the analog data fed from one of the D/A converters 141 to 149 and supplies the amplified data to a signal line of the liquid crystal panel. Including a plurality of switches and voltage levels, each of the D/A converters 141 to 149 activates these switches in response to a digital signal fed from one of the line buffers 131 to 139 and outputs a selected voltage.

SUMMARY OF THE INVENTION

Liquid crystal displays, for example, have evolved to offer larger liquid crystal panels, higher definition and higher density, with the number of signal lines surpassing 500. On the other hand, the voltages supplied to liquid crystal panels today require more accuracy. This has lead to a higher failure rate of D/A converters. If a D/A converter becomes defective, the signal line associated with the faulty D/A converter does not light up, or a line defect occurs therein due to poor gray levels.

In light of the foregoing, it is a desire of the present invention to provide a semiconductor integrated circuit or liquid crystal drive circuit capable of avoiding the use of a defective D/A converter by changing the connections of the defective and other D/A converters so as to repair the integrated circuit as a whole and prevent the same circuit from becoming defective.

To solve the above problem, the present invention has taken the following measures.

According to an embodiment of the present invention, a semiconductor integrated circuit includes line buffers, alpha channel first selector and alpha and beta channel D/A converters. The line buffers convert serial data into alpha and beta channel parallel digital signals. The alpha channel first selector selectively switches one of the alpha and beta channel digital signals and outputs the selected signal. The alpha channel D/A converter converts the digital signal fed from the alpha channel first selector into an analog signal. The beta channel D/A converter converts the beta channel digital signal into an analog signal. The semiconductor integrated circuit further includes a redundant D/A converter, alpha and beta channel second selectors and alpha and beta channel amplifiers. The redundant D/A converter converts the alpha channel digital signal into an analog signal. The alpha channel second selector selectively switches one of two analog signals, one from the redundant D/A converter and another from the alpha channel D/A converter and outputs the selected signal. The beta channel second selector selectively switches one of two analog signals, one from the alpha channel D/A converter and another from the beta channel D/A converter and outputs the selected signal. The alpha channel amplifier amplifies the analog signal fed from the alpha channel second selector. The beta channel amplifier amplifies the analog signal fed from the beta channel second selector.

According to an embodiment of the present invention, the semiconductor integrated circuit is characterized as follows. That is, the alpha channel includes first to nth channels with the first channel being higher in order and the nth channel being lower in order (where n is an integer equal to or greater than 2). The line buffers generate digital signals of the first to nth channels. Each of the first to nth channels includes a first selector, D/A converter, second selector and amplifier. Assuming that the redundant D/A converter is the highest-order zeroth D/A converter, the D/A converters in the first to nth channels are respectively the first to nth D/A converters with the first D/A converter being higher in order and the nth D/A converter being lower in order, and the D/A converter in the beta channel is the lowest-order D/A converter, the first selector in each of the first to nth channels selectively switches one of two digital signals, one of the own channel and another of the channel lower in order than the own channel, and outputs the selected signal to the D/A converter in the own channel. The second selector in each of the first to nth channels selectively switches one of two analog signals, one from the D/A converter in the own channel and another from the higher-order D/A converter, and outputs the selected signal to the amplifier in the own channel.

According to an embodiment of the present invention, the semiconductor integrated circuit is characterized as follows. That is, the first selector in each of the first to nth channels selectively switches one of two digital signals, one of the own channel and another of the channel lower in order by one than the own channel, and outputs the selected signal to the D/A converter in the own channel. The second selector in each of the first to nth channels selectively switches one of two analog signals, one from the D/A converter in the own channel and another from the D/A converter higher in order by one, and outputs the selected signal to the amplifier in the own channel.

According to an embodiment of the present invention, the semiconductor integrated circuit is characterized as follows. That is, in the presence of channels higher in order than a jth channel (where j is an integer equal to or greater than 1 and equal to or smaller than n), the first selector in each of the channels higher in order than the jth channel outputs a digital signal of a lower-order channel to the D/A converter in the own channel in response to a switching signal. The first selector in each of the channels lower in order than the jth channel outputs a digital signal of the own channel to the D/A converter in the own channel. In the presence of the jth channel and channels higher in order than the jth channel, the second selector in each of the channels higher in order than the jth channel outputs an analog signal, generated by the higher-order D/A converter, to the amplifier in the own channel in response to the switching signal. The second selector in each of the channels lower in order than the jth channel outputs an analog signal fed from the D/A converter in the own channel to the amplifier in the own channel.

According to an embodiment of the present invention, the semiconductor integrated circuit is characterized as follows. That is, the amplifier in each channel functions as a malfunction detector adapted to inspect the D/A converter in the own channel to determine whether the D/A converter malfunctions and generate a malfunction determination signal. Each of the channels further includes a logic circuit and latch circuit. The logic circuit takes the logical sum of two signals, a malfunction determination signal generated by the amplifier in the own channel and a malfunction detection signal generated, in the presence of a channel lower in order than the own channel, by the lower-order channel. The latch circuit holds a logical sum signal fed from the logic circuit in the own channel and generates a malfunction detection signal, in the presence of a channel higher in order than the own channel, for the higher-order channel and a switching signal to be supplied to the first and second selectors in the own channel.

According to an embodiment of the present invention, the semiconductor integrated circuit is characterized as follows. That is, each of the channels includes first to xth (where x is an integer equal to or greater than 2) sub-channels. The first selector in each of the channels includes first to xth sub-first selectors. The D/A converter in each of the channels includes first to xth sub-D/A converters. The zeroth D/A converter includes first to xth sub-D/A converters. The second selector in each of the channels includes first to xth sub-second selectors. The amplifier in each of the channels includes first to xth sub-amplifiers. A pth (where p is an integer between 1 and x) sub-first selector in each of the channels selectively switches one of two digital signals, one of a pth sub-channel of the own channel and another, in the presence of a channel lower in order than the own channel, of a pth sub-channel of the lower-order channel, and outputs the selected signal to a pth sub-D/A converter in the own channel. A pth sub-second selector in each of the channels selectively switches one of analog signals, one from the pth sub-D/A converter in the own channel and another, in the presence of a channel higher in order than the own channel, from the pth sub-D/A converter in the higher-order channel, and outputs the selected signal. A pth sub-amplifier in each of the channels amplifies an analog signal output from a pth sub-second selector in the own channel.

According to an embodiment of the present invention, the semiconductor integrated circuit is characterized as follows. That is, each of the sub-D/A converters includes an operational amplifier. A given sub-channel of the first to nth sub-channels includes third and fourth selectors. The third selector switches the function of the operational amplifier from amplifier to comparator. The fourth selector switches the input of the operational amplifier from input from the second selector in the own sub-channel to parallel inputs, one from the second selector in the own sub-channel and another from the second selector in other sub-channel.

According to an embodiment of the present invention, a liquid crystal drive circuit includes line buffers, ith (where i is an integer between 1 and n−1) channel first selector and redundant zeroth D/A converter. The line buffers convert serial data into parallel digital signals for the first to nth (where n is an integer equal to or greater than 2) channels. The ith channel first selector selectively switches one of two digital signals, one of the ith channel and another of an i+1th channel and outputs the selected signal. The redundant zeroth D/A converter converts the digital signal of the first channel into an analog signal. The liquid crystal drive circuit further includes an ith D/A converter, ith channel second selector and ith channel amplifier. The ith D/A converter converts the digital signal output from the ith channel first selector into an analog signal. The ith D/A converter belongs to the ith channel. The ith channel second selector selectively switches one of two analog signals, one from the ith D/A converter and another from an i−1th D/A converter and outputs the selected signal. The ith channel amplifier amplifies the analog signal output from the ith channel second selector. The liquid crystal drive circuit uses the analog signal, amplified by the amplifier, as an image signal.

The semiconductor integrated circuit according to an embodiment of the present invention includes line buffers adapted to convert serial data into alpha and beta channel parallel digital signals. The semiconductor integrated circuit further includes an alpha channel first selector and alpha channel D/A converter. The alpha channel first selector selectively switches one of two digital signals, one of the alpha channel and another of the beta channel, and outputs the selected signal. The alpha channel D/A converter converts the digital signal fed from the alpha channel first selector into an analog signal. The semiconductor integrated circuit still further includes a beta channel D/A converter and redundant D/A converter. The beta channel D/A converter converts the beta channel digital signal into an analog signal. The redundant D/A converter converts the alpha channel digital signal into an analog signal. The semiconductor integrated circuit still further includes an alpha channel second selector. The alpha channel second selector selectively switches one of two analog signals, one from the redundant D/A converter and another from the alpha channel D/A converter and outputs the selected signal. The semiconductor integrated circuit still further includes a beta channel second selector. The beta channel second selector selectively switches one of two analog signals, one from the alpha channel D/A converter and another from the beta channel D/A converter and outputs the selected signal. The semiconductor integrated circuit still further includes alpha and beta channel amplifiers. The alpha channel amplifier amplifies the analog signal fed from the alpha channel second selector. The beta channel amplifier amplifies the analog signal fed from the beta channel second selector. That is, if one of the D/A converters is determined to be defective, the first and second selectors can change the connection from the D/A converter determined to be defective toward the redundant D/A converter. This makes it possible to avoid the defective D/A converter for normal operation.

DETAILED DESCRIPTION OF THE PREFERRED EMBODIMENTS

Figure 1B:
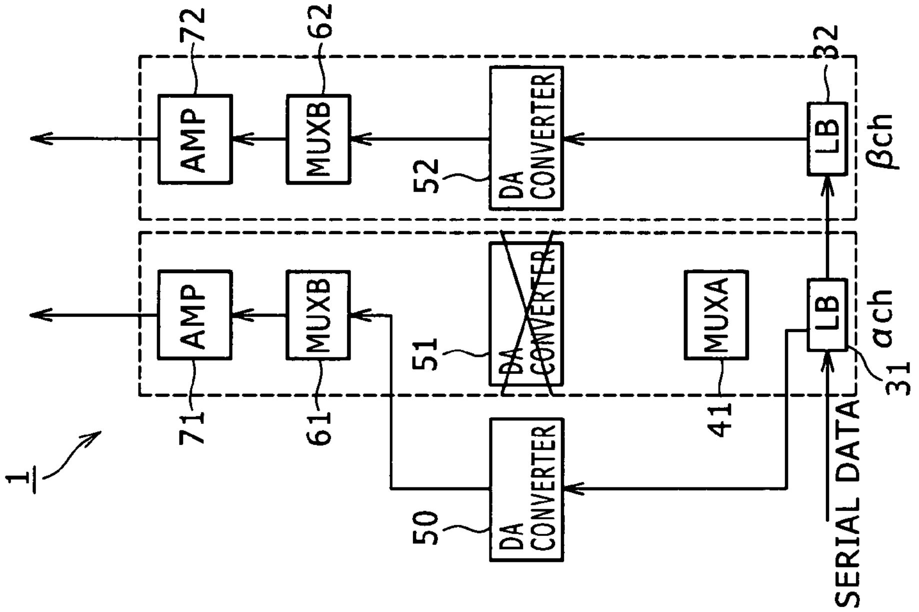
FIGS. 1A and 1B are diagrams illustrating the configuration of a semiconductor integrated circuit according to an embodiment of the present invention.
Figure 1A:
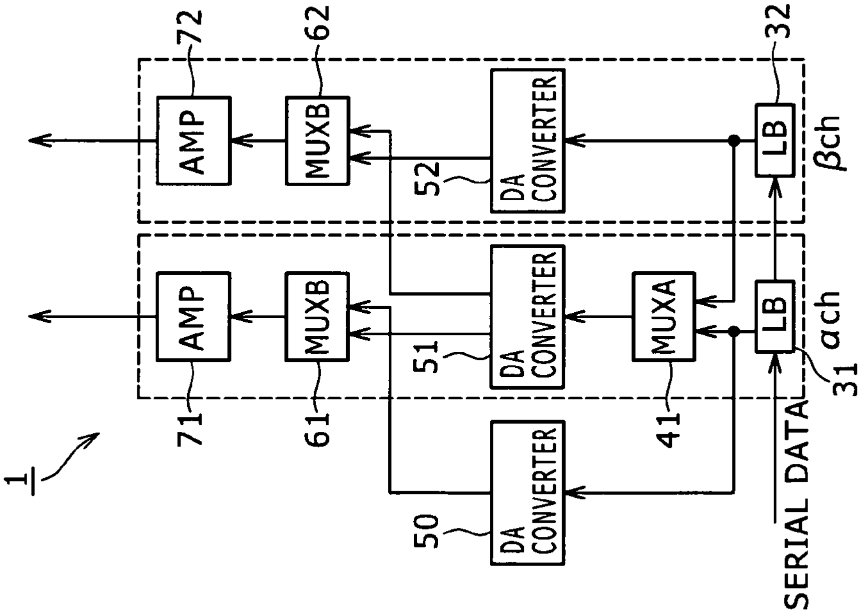

FIG. 1A illustrates a basic configuration of a semiconductor integrated circuit 1 according to an embodiment of the present invention. The semiconductor integrated circuit 1 according to an embodiment of the present invention includes alpha and beta channels and a redundant D/A converter 50. The alpha channel includes a line buffer 31, first selector 41, D/A converter 51, second selector 61 and amplifier 71. The beta channel includes a line buffer 32, D/A converter 52, second selector 62 and amplifier 72.

The line buffers 31 and 32 receive serial data and convert it into parallel digital signals for the alpha and beta channels. The redundant D/A converter 50 converts the alpha channel digital signal into an analog signal. The alpha channel first selector 41 selectively switches one of two digital signals, one of the alpha channel and another of the beta channel, and outputs the selected signal to the alpha channel D/A converter 51. The alpha channel second selector 61 selectively switches one of two analog signals, one from the redundant D/A converter 50 and another from the alpha channel D/A converter 51 and outputs the selected signal to the alpha channel amplifier 71. The alpha channel amplifier 71 outputs an amplified analog signal to external equipment.

The beta channel D/A converter 52 converts the alpha channel digital signal into an analog signal. The beta channel second selector 62 selectively switches one of two analog signals, one from the alpha channel D/A converter 51 and another from the beta channel D/A converter and outputs the selected signal to the beta channel amplifier 72. The beta channel amplifier 72 outputs an amplified analog signal to external equipment.

In normal operation, the alpha channel first selector 41 selects the digital signal of the own channel and outputs the signal to the D/A converter 51 in the own channel. Further, the alpha channel second selector 61 selects the analog signal from the D/A converter in the own channel and outputs the signal to the amplifier 71 in the own channel. The beta channel second selector 62 selects the analog signal from the D/A converter in the own channel and outputs the signal to the amplifier 72 in the own channel.

FIG. 1B illustrates redundancy repair performed using the redundant D/A converter 50 because of the malfunctioning alpha channel D/A converter 51. The alpha channel second selector 61 selects the analog signal from the redundant D/A converter 50 and outputs the signal to the amplifier 71 in the own channel. This makes it possible to avoid using the defective D/A converter and repair the semiconductor integrated circuit 1.

Further, if the beta channel D/A converter 52 malfunctions, the alpha channel first selector 41 selects the beta channel digital signal and outputs the signal to the D/A converter 52 in the own channel. The beta channel second selector 62 selects the analog signal from the alpha channel D/A converter 51 and outputs the signal to the amplifier 72 in the own channel. The alpha channel second selector 61 selects the analog signal from the redundant D/A converter 50 and outputs the signal to the amplifier 71 in the own channel. That is, redundancy repair is achieved by shifting the signal flow by one channel toward the redundant D/A converter. This makes it possible to repair the semiconductor integrated circuit 1 even in the event of malfunction of either of the alpha and beta channel D/A converters.

Further, the alpha channel may include first to nth channels with the first channel being higher in order and the nth channel being lower in order. Each of the first to nth channels includes a first selector, D/A converter, second selector and amplifier. The redundant D/A converter is the highest-order zeroth D/A converter. The D/A converters in the first to nth channels are respectively the first to nth D/A converters with the first D/A converter being higher in order and the nth D/A converter being lower in order. The D/A converter in the beta channel is the lowest-order D/A converter.

When the D/A converters in the respective channels are ordered as described above, the first selector in each of the first to nth channels selectively switches one of two digital signals, one of the own channel and another of the channel lower in order than the own channel, and outputs the selected signal to the D/A converter in the own channel. On the other hand, the second selector in each of the first to nth channels selectively switches one of two analog signals, one from the D/A converter in the own channel and another from the higher-order D/A converter, and outputs the selected signal to the amplifier in the own channel. This makes it possible to allow repair the semiconductor integrated circuit containing a number of channels even in the event of malfunction of the D/A converter in one of the channels.

Alternatively, the first selector in each of the first to nth channels may selectively switch one of the digital signals, one of the own channel and others of a plurality of the channels lower in order by a plurality than the own channel, and output the selected signal. On the other hand, the second selector in each of the first to nth channels may selectively switch one of the analog signals, one generated by the D/A converter in the channel identical in order to the own channel and others generated by a plurality of D/A converters in the channels higher in order by a plurality than the own channel, and output the selected signal. This configuration makes it possible to perform redundancy repair even in the event of malfunction of a plurality of D/A converters.

Further, the amplifier in each of the channels may additionally be capable of detecting whether the D/A converter in the own channel malfunctions, thereby functioning as a malfunction detector adapted to generate a malfunction determination signal. Each of the first to nth channels includes a logic circuit adapted to take the logical sum of two signals, a malfunction determination signal generated by the amplifier in the own channel and a malfunction detection signal input from a channel lower in order by one than the own channel, from the lower-order channel. Each of the first to nth channels also includes a latch circuit adapted to hold a logical sum signal fed from the logic circuit in the own channel and generate a switching signal to be output to at least the second selector in the own channel. The latch circuit also generates a malfunction detection signal adapted to inform, in the presence of a higher-order channel, the higher-order channel that a malfunction determination signal has been generated by the lower-order channel.

This at least detaches the connection of a malfunctioning D/A converter by means of the second selector in the event of detection of a malfunctioning sub-D/A converter, thus making it possible to globally shift the connections of the D/A converters higher in order than the malfunctioning D/A converter toward the redundant D/A converter.

Further, each channel includes a plurality of sub-channels. The first selector, D/A converter, second selector and amplifier in each of the channels include a plurality of sub-first selectors, sub-D/A converters, sub-second selectors and sub-amplifiers, respectively. Each of the sub-first selectors in each of the channels selectively switches one of two digital signals, one of the own sub-channel of the own channel and another of the associated sub-channel of the channel lower in order than the own channel. Each of the sub-D/A converters in each of the channels converts the digital signal output from the sub-first selector in the own sub-channel of the own channel into an analog signal. Each of the sub-second selectors in each of the channels selectively switches one of two analog signals, one from the sub-D/A converter in the own channel and another, in the presence of a channel higher in order than the own channel, from the sub-D/A converter in the associated sub-channel of the higher-order channel, and outputs the selected signal. This makes it possible to perform redundancy repair of the semiconductor integrated circuit 1 even in the event of malfunction of one of the sub-D/A converters when there are a plurality of sub-channels in each channel for more complex D/A conversion.

Further, the amplifier in each of the channels includes an operational amplifier. A predetermined sub-channel includes a third selector adapted to switch the function of the operational amplifier from amplifier to comparator, and a fourth selector adapted to switch the input. The fourth selector switches the input from the second selector in the own sub-channel over to parallel inputs, one from the second selector in the own sub-channel and another from the second selector in other sub-channel. Accordingly, comparison between the output of the sub-D/A converter in the own sub-channel and that of the sub-D/A converter in other sub-channel in inspection mode is made, permitting detection of a malfunctioning sub-D/A converter.

A concrete description will be given below of the preferred embodiments of the present invention with reference to the accompanying drawings.

First Embodiment

Figure 2:
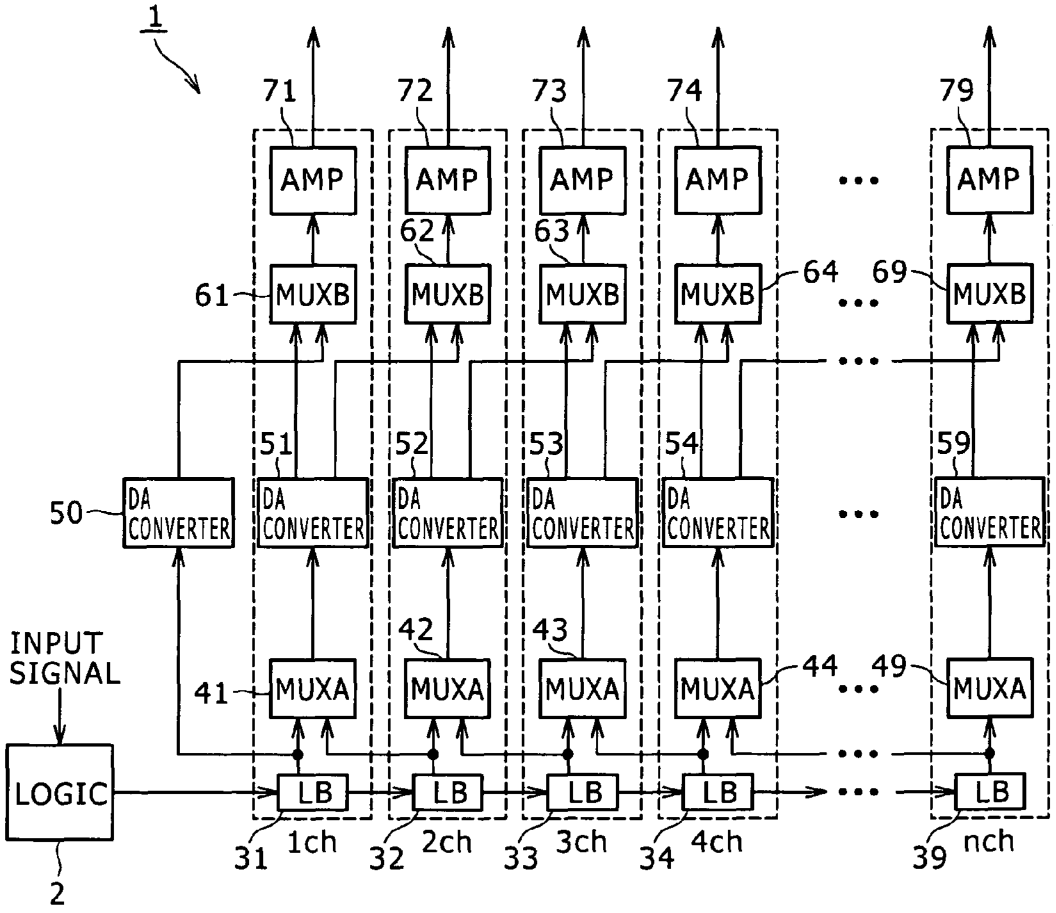
FIG. 2 is a diagram illustrating the configuration of the semiconductor integrated circuit according to an embodiment of the present invention.

FIG. 2 is a diagram illustrating the configuration of the semiconductor integrated circuit 1 according to a first embodiment of the present invention. The semiconductor integrated circuit 1 receives serial data and outputs parallel analog signals of the first to nth channels. A concrete description will be given below. (It should be noted that, in the description given below, the nth channel is the lowest-order channel. However, the nth channel need not necessarily be arranged last.)

Line buffers (LB) 31 to 39 in the first to nth channels generate digital signals of the first to nth channels, respectively. The first selector 41 in the first channel receives two digital signals, one from the line buffer 31 in the first channel and another from the line buffer 32 in the second channel, selectively switches either of the two digital signals and outputs the selected signal. The D/A converter 51 in the first channel converts the digital signal fed from the first selector into an analog signal. The D/A converter in the first channel is the first in order among the D/A converters. It should be noted that, in the drawings, MUXA (multiplexer A) denotes the first selectors, and MUXB (multiplexer B) the second selectors.

The zeroth D/A converter 50 even higher in order than the first D/A converter is a redundant D/A converter adapted to convert the digital signal from the line buffer 31 in the first channel into an analog signal. The second selector 61 in the first channel receives two analog signals, one from the first-order D/A converter 51 and another from the zeroth redundant D/A converter 50, and outputs either of the two signals. The amplifier (AMP) 71 in the first channel amplifies the analog signal fed from the second selector 61 in the first channel and outputs the amplified signal.

The second channel is configured in the same manner as the first channel. The first selector 41 in the second channel receives two digital signals, one from the line buffer 32 in the second channel and another from the line buffer 33 in the third channel, selectively switches either of the two digital signals and outputs the selected signal to the D/A converter 52 in the second channel. The second selector 62 in the second channel receives two analog signals, one from the D/A converter 52 in the second channel that is the second in order and another from the D/A converter 51 in the first channel that is the first in order, and outputs either of the two analog signals to the amplifier 72 in the second channel. The third and subsequent channels are configured in the same manner. It should be noted that the D/A converters include the D/A converters 51 to 59 that are respectively the first to nth in order and the redundant highest-order zeroth D/A converter 50.

Figure 3:
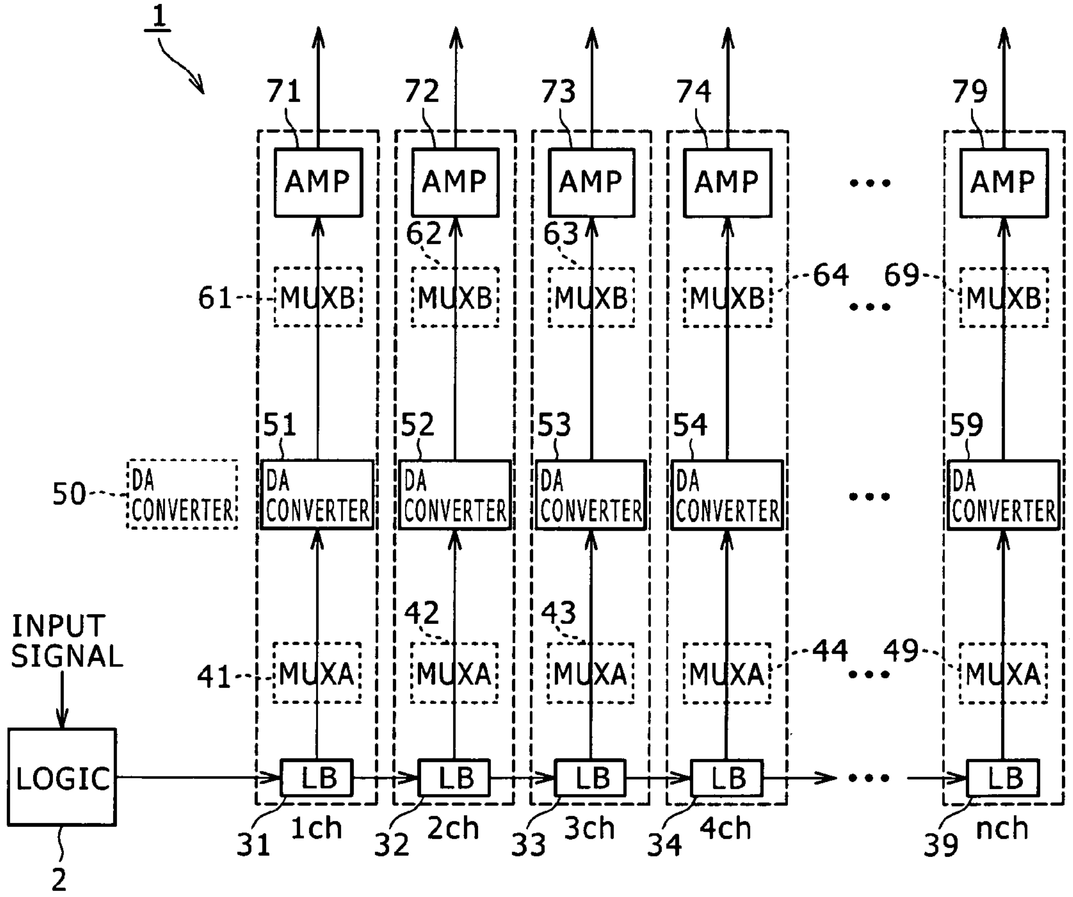
FIG. 3 is a diagram illustrating the connections when there is no malfunctioning D/A converter in the semiconductor integrated circuit according to the embodiment of the present invention.
Figure 4:
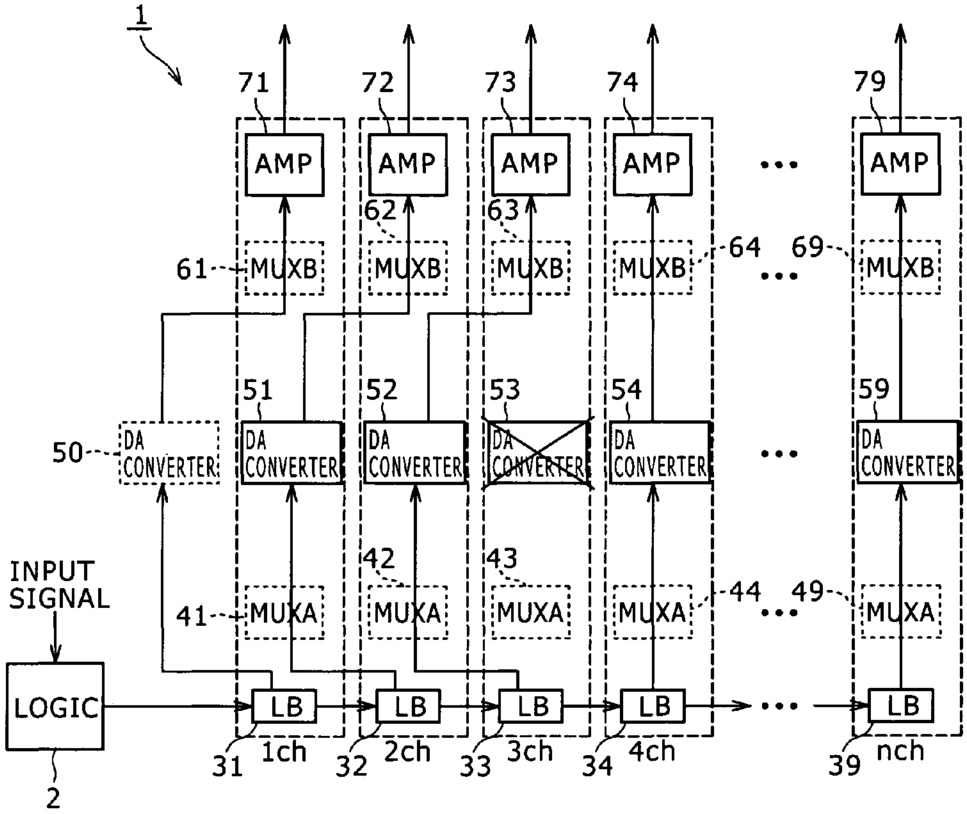
FIG. 4 is a diagram illustrating the connections if the D/A converter in the third channel malfunctions in the semiconductor integrated circuit according to the embodiment of the present invention.

FIGS. 3 and 4 are diagrams for describing the operation of the semiconductor integrated circuit 1. The same circuit 1 is configured in the same manner as in FIG. 2. FIG. 3 illustrates the connections of the first selectors 41 to 49 and second selectors 61 to 69 when none of the D/A converters 51 to 59 malfunctions. FIG. 4 illustrates the connections of the first selectors 41 to 49 and second selectors 61 to 69 if the D/A converter 53 in the third channel that is the third in order malfunctions.

As illustrated in FIG. 3, when all the D/A converters function properly, the first selectors 41 to 49 in the respective channels select the digital signals output respectively from the line buffers 31 to 39 in the own channel and output the selected signals respectively to the D/A converters 51 to 59 in the own channel. The second selectors 61 to 69 in the respective channels select the analog signals output respectively from the D/A converters 51 to 59 in the own channel and output the selected signals respectively to the amplifiers 71 to 79 in the own channel.

As illustrated in FIG. 4, if the third D/A converter in the third channel malfunctions, the first selector 42 in the second channel outputs the digital signal from the line buffer 33 in the third channel to the second D/A converter 52 in the second channel. The second selector 63 in the third channel selects the analog signal output from the second D/A converter 52 in the second channel and outputs the selected signal to the amplifier 73 in the third channel.

Similarly, the first selector 41 in the first channel outputs the digital signal from the line buffer 32 in the second channel to the first D/A converter 51 in the first channel. The second selector 62 in the second channel selects the analog signal output from the second D/A converter 51 in the first channel and outputs the selected signal to the amplifier 72 in the second channel.

Further, the second selector 61 in the first channel selects the analog signal output from the redundant highest-order zeroth D/A converter 50 and outputs the selected signal to the amplifier 71 in the first channel.

In the fourth to nth channels lower in order than the third channel, on the other hand, each of the first selectors selects the digital signal output from the line buffer in the own channel and outputs the selected signal to the D/A converter in the own channel. Each of the second selectors selects the analog signal converted by the D/A converter in the own channel and outputs the selected signal to the amplifier in the own channel.

As described above, if there is a malfunctioning D/A converter, the present embodiment shifts the signal path in each channel toward the redundant D/A converter by means of the first and second selectors in the higher channel, thus bypassing the malfunctioning D/A converter for normal operation. This makes it possible to repair the semiconductor integrated circuit even in the event of malfunction of one of the D/A converters.

Although, in the first embodiment, the redundant zeroth D/A converter 50 is provided on the side of the first channel that is higher in order, the same converter 50 may be alternatively provided on the side of the nth channel that is the lowest in order. The channels can be formed parallel and adjacent to each other on the surface of a semiconductor substrate.

On the other hand, the redundant D/A converter 50 can be provided both on the side of the first channel that is higher in order and of the nth channel that is lower in order. The first selector in each of the channels receives three digital signals, one from the line buffer in the own channel, another from the one in the channel higher in order by one than the own channel and still another from the one in the channel lower in order by one than the own channel, selectively switches one of these digital signals and outputs the selected signal to the D/A converter in the own channel. The second selector in each of the channels receives three analog signals, one from the D/A converter in the own channel, another from the one in the channel higher in order by one than the own channel and still another from the one in the channel lower in order by one than the own channel, selectively switches one of these digital signals and outputs the selected signal to the amplifier in the own channel. This makes it possible to repair the semiconductor integrated circuit even in the event of malfunction of two D/A converters by shifting the signal paths toward the highest- and lowest-order sides.

Figure 5:
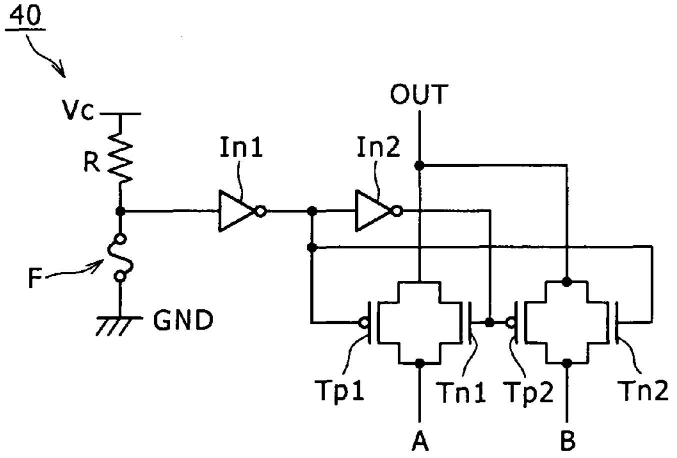
FIG. 5 is a diagram illustrating the configuration of a selector according to the embodiment of the present invention.

FIG. 5 is a circuit diagram illustrating an example of a selector 40 used in the semiconductor integrated circuit according to an embodiment of the present invention. In the present example, a fuse is blown to allow the selector to selectively switch one of two input signals and output the selected signal.

An input signal A is fed to one of the terminals to which a P-channel transistor Tp1 and an N-channel transistor Tn1 are connected in parallel. The other terminal is connected to an output terminal OUT. An input signal B is fed to one of the terminals to which a P-channel transistor Tp2 and an N-channel transistor Tn2 are connected in parallel. The other terminal is connected to the output terminal OUT.

A resistor R and fuse F are connected in series and inserted between a voltage Vc and ground GND. The connection point between the resistor R and fuse F is connected to the input terminal of a first inverter In1. The output terminal of the first inverter In1 is connected to the input terminal of a second inverter In2 and to the gates of the transistors Tp1 and Tn2. The output terminal of the second inverter In2 is connected to the gates of the transistors Tn1 and Tp2.

When a voltage is applied to the Vc, the input and output terminals of the first inverter In1 are respectively low and high, and the input and output terminals of the second inverter In1 are respectively high and low. As a result, the transistor Tp1 is off because the gate thereof is high, and the transistor Tn1 is also off because the gate thereof is low. On the other hand, the transistor Tp2 is on because the gate thereof is low, and the transistor Tn2 is also on because the gate thereof is high. Therefore, the signal A is interrupted while the signal B is output.

The fuse is blown, for example, by a laser beam. As a result, the level of the input terminal of the first inverter In1 changes to a high level. This changes the potentials of the gates of the transistors Tp1, Tn1, Tp2 and Tn2, interrupting the signal B and outputting the signal A. This selector using a fuse is applicable to the first selectors 41 to 49 and second selectors 61 to 69 shown in FIG. 2.

For example, the selector 40 shown in FIG. 5 is used as the first selectors 41 to 49 and second selectors 61 to 69 shown in FIG. 2. When the selector 40 is used as the first selectors 41 to 49, two digital signals are fed, one of the own channel as the signal B, and another of the channel lower in order than the own channel as the signal A. When the selector 40 is used as the second selectors 61 to 69, two analog signals are fed, one from the D/A converter identical in order to the own channel as the signal A, and another from the D/A converter in the channel higher in order than the own channel as the signal B.

For example, as shown in FIG. 4, if the D/A converter 53 in the third channel malfunctions, the fuses F of the first selectors 41 and 42 and second selectors 61 to 63 in the first to third channels are blown, for example, by a laser beam. As a result, the analog signals converted by the D/A converters higher in order by one are fed and amplified respectively in the first to third channels.

In the above description, the fuse F was switched from a connected to a disconnected state so as to switch the input from the signal B to signal A as illustrated in FIG. 5. Alternatively, a signal generated by other circuit, such as a switching signal generated in the event of detection of a malfunctioning sub-D/A converter, may be fed to the input terminal of the first inverter In1 so as to switch one of the signals A and B selectively.

A case was described with reference to FIG. 4 in which the semiconductor integrated circuit was repaired when the third D/A converter 53 in the third channel malfunctioned. However, repair is more commonly achieved as described below. That is, we assume that the jth D/A converter in the jth channel malfunctions. In this case, when there are channels higher in order than the jth channel, the first selector in each of the higher-order channels outputs the digital signal of the channel lower in order by one than the own channel to the D/A converter in the own channel. Further, the first selector in each of the channels lower in order than the jth channel outputs the digital signal of the own channel to the D/A converter in the own channel.

The second selector in each of the jth channel and the channels higher in order than the jth channel receives a switching signal and outputs the analog signal generated by the D/A converter higher in order by one to the amplifier in the own channel. The second selector in each of the channels lower in order than the jth channel outputs the analog signal from the D/A converter in the own channel to the amplifier in the own channel.

Second Embodiment

Figure 6:
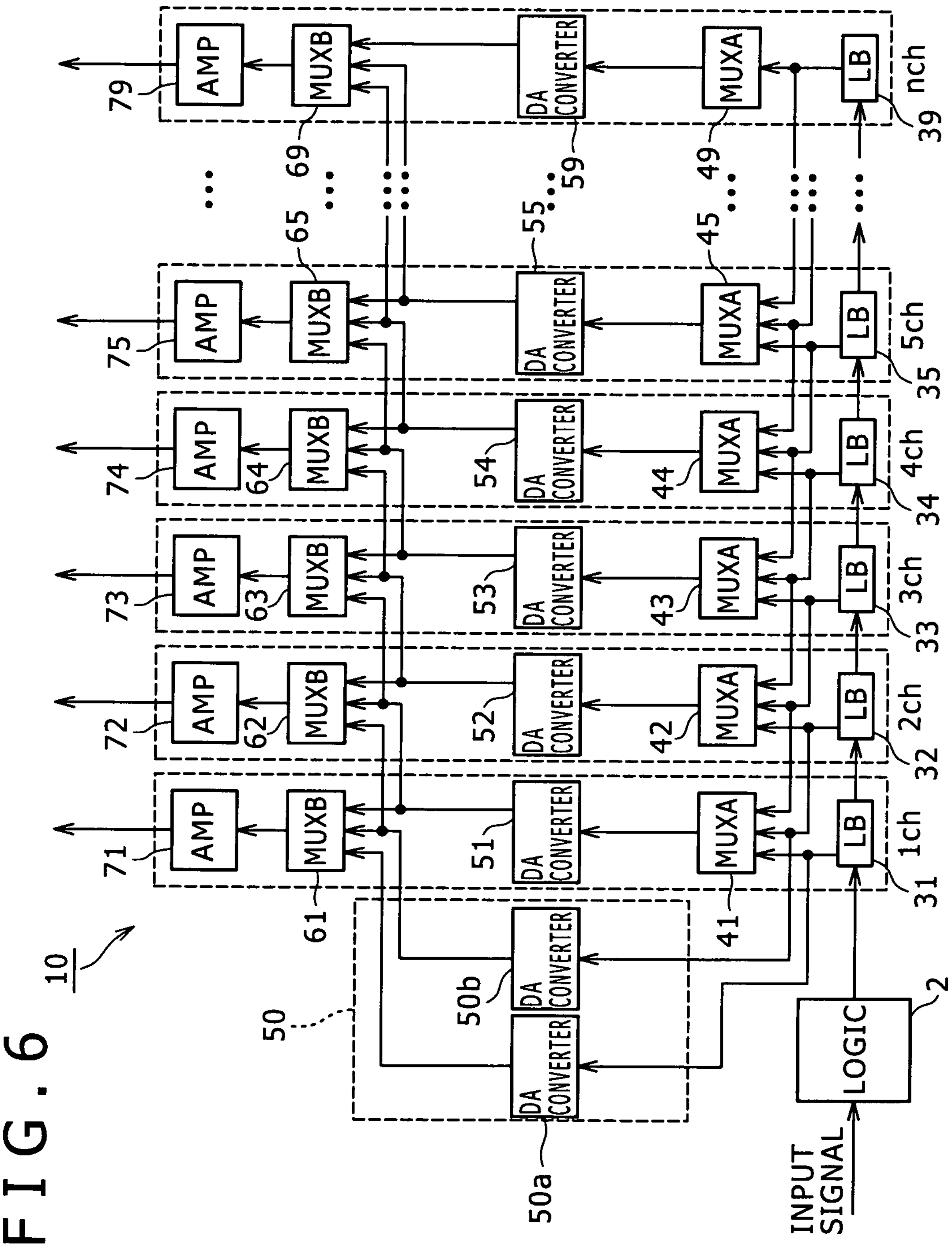
FIG. 6 is a diagram illustrating a configuration example of the semiconductor integrated circuit according to another embodiment of the present invention.

FIG. 6 is a schematic diagram illustrating the configuration of a semiconductor integrated circuit 10 according to a second embodiment of the present invention. In the second embodiment, the redundant zeroth D/A converter 50 includes two D/A converters 50*a* and 50*b*. In the second embodiment, repair of the semiconductor integrated circuit 10 can be performed even in the event of malfunction of two D/A converters among those in the first to nth channels. Like components and components having like functions are denoted by like reference numerals.

A logic circuit 2 outputs serial data to the line buffers 31 to 39. The same buffers 31 to 39 generate parallel digital signals of the first to nth channels. The first selector 41 in the first channel receives the digital signals of the first to third channels, selectively switches one of these signals and outputs the selected signal. The D/A converter 51 in the first channel converts the digital signal fed from the first selector 41 into an analog signal. The same converter 51 is the first in order among the D/A converters.

The zeroth D/A converter 50, even higher in order than the first D/A converter, includes the two redundant D/A converters 50*a* and 50*b*. The redundant D/A converter 50*a* receives the digital signal of the first channel and converts this signal into an analog signal. The redundant D/A converter 50*b* receives the digital signal of the second channel and converts this signal into an analog signal. The second selector 61 in the first channel receives three analog signals, one each from the first D/A converter 51 and redundant zeroth D/A converters 50*a* and 50*b*, and outputs one of these analog signals. The amplifier 71 in the first channel amplifies the analog signal fed from the second selector 61 in the first channel and outputs the amplified signal.

The first selector 42 in the second channel receives the digital signals of the second to fourth channels, selectively switches one of these signals and outputs the selected signal. The D/A converter 52 in the second channel converts the digital signal fed from the first selector 42 into an analog signal. The same converter 52 is the second in order among the D/A converters.

The second selector 62 in the second channel receives three analog signals, one each from the second D/A converter 52, first D/A converter 51 and redundant zeroth D/A converter 50*b*, and outputs one of these analog signals. The amplifier 72 in the second channel amplifies the analog signal fed from the second selector 62 in the second channel and outputs the amplified signal.

The first selector 43 in the third channel receives the digital signals of the third to fifth channels, selectively switches one of these signals and outputs the selected signal. The D/A converter 53 in the third channel converts the digital signal fed from the first selector 43 into an analog signal. The same converter 53 is the third in order among the D/A converters.

The second selector 63 in the third channel receives three analog signals, one each from the third D/A converter 53, second D/A converter 52 and first D/A converter 51, and outputs one of these analog signals. The amplifier 73 in the third channel amplifies the analog signal fed from the second selector 63 in the third channel and outputs the amplified signal. The same is true for the fourth and subsequent channels.

Figure 7:
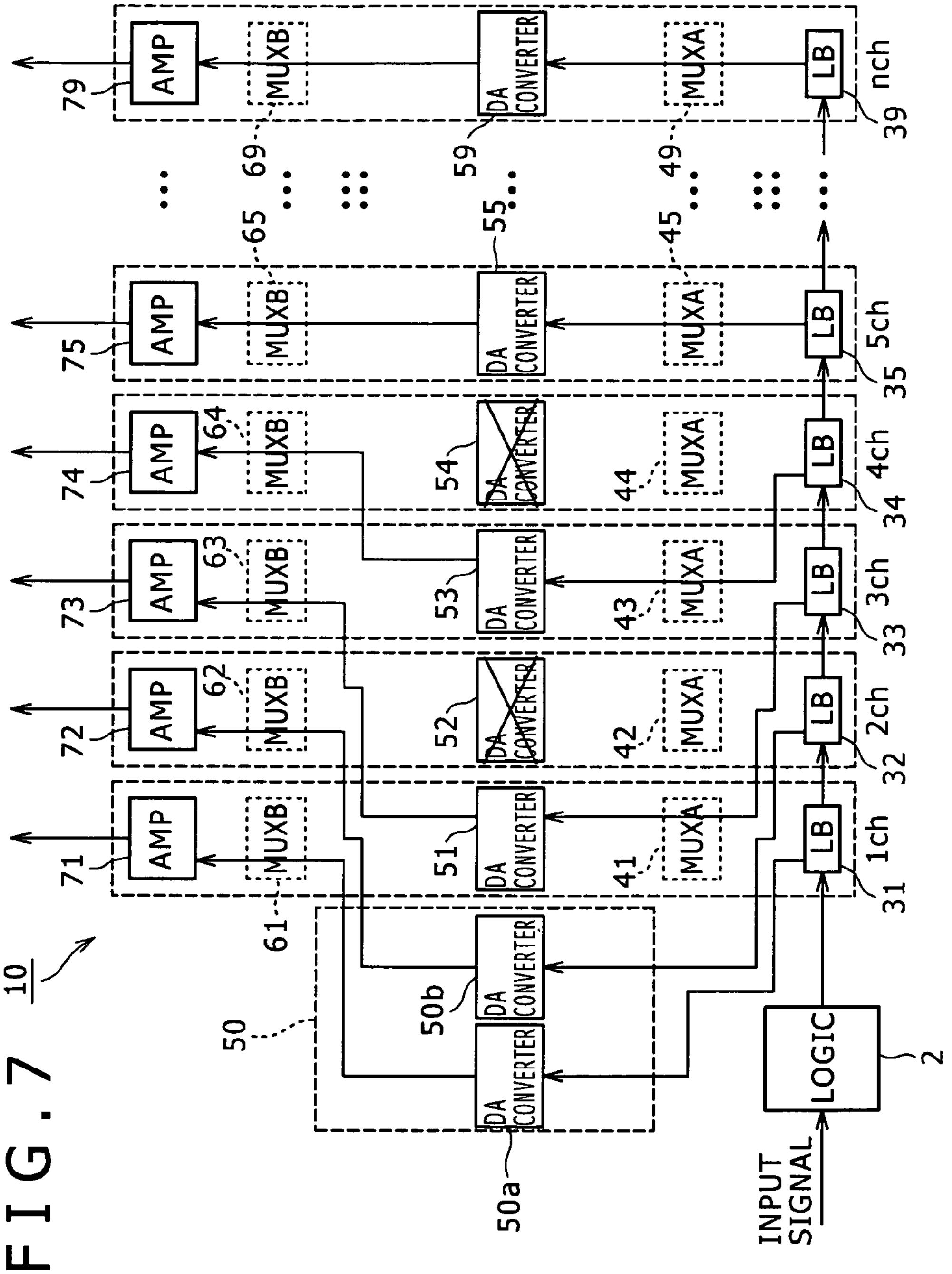
FIG. 7 is a diagram illustrating the connections if the D/A converters in the second and fourth channels malfunction in the semiconductor integrated circuit according to the embodiment of the present invention.

FIG. 7 illustrates the connections of the first selectors 41 to 49 and second selectors 61 to 69 of the semiconductor integrated circuit 10 shown in FIG. 6 if the D/A converters 52 and 54 in the second and fourth channels malfunction. The first selector 43 in the third channel receives the digital signal from the line buffer 34 in the fourth channel and outputs the signal to the D/A converter 53 in the third channel that is the third in order. The second selector 64 in the fourth channel outputs the analog signal fed from the D/A converter 53 that is the third in order and outputs the signal to the amplifier 74 in the fourth channel.

The first selector 41 in the first channel outputs the digital signal from the line buffer 33 in the third channel to the D/A converter 51 in the first channel that is the first in order. The second selector 63 in the third channel outputs the analog signal from the D/A converter 51 that is the first in order to the amplifier 73 in the third channel. The second selector 62 in the second channel outputs the analog signal from the redundant D/A converter 50*b* that is the zeroth in order to the amplifier 72 in the second channel. The second selector 61 in the first channel outputs the analog signal from the redundant D/A converter 50*a* that is the zeroth in order to the amplifier 71 in the first channel.

In each of the channels lower in order than the fourth channel, on the other hand, the digital signal from the line buffer is output by the first selector in the channel in question to the D/A converter in the channel in question. Further, the analog signal from the D/A converter is output to the amplifier in the channel in question via the second selector in the channel in question.

As described above, even if two D/A converters malfunction, these D/A converters can be bypassed by shifting the signal paths toward the redundant circuit, thus making it possible to repair the semiconductor integrated circuit. Further, easy and instantaneous repair can be achieved by activating the first and second selectors by means of a switching signal. Still further, repair can be achieved both if the malfunctioning D/A converters are not consecutive in order as illustrated in FIG. 7 and if they are consecutive in order.

In the second embodiment, the redundant zeroth D/A converter includes the two D/A converters 50*a* and 50*b* to repair two malfunctioning D/A converters. However, the present invention is not limited thereto. Instead, the zeroth redundant D/A converter may include k (where k is an integer equal to or greater than one but smaller than n) redundant D/A converters to repair k malfunctioning D/A converters.

In this case, the zeroth redundant D/A converter includes 01st to 0kth or k redundant D/A converters. The 0kth redundant D/A converter that is higher in order than the first D/A converter receives the digital data of the 0kth channel. The 0(k−1)th redundant D/A converter that is higher in order than the 0kth redundant D/A converter receives the digital signal from the (k−1)th channel. The same is true for the subsequent channels. That is, the 01st redundant D/A converter that is higher in order than the 02nd D/A converter receives the digital signal of the first channel.

Further, the selector in the first channel receives the digital signals of the first to (1+k)th channels, selectively switches one of the signals and outputs the signal to the D/A converter that is the first in order. The second selector in the first channel receives the analog signals from the 01st to 0kth redundant D/A converters and the first D/A converter in the first channel, selectively switches one of the signals and outputs the signal to the amplifier in the first channel. The first selector in the second channel receives the digital signals of the second to (2+k)th channels, selectively switches one of the signals and outputs the signal to the D/A converter that is the second in order. The second selector in the second channel receives the analog signals from the 02nd to 0kth redundant D/A converters and the first and second D/A converters in the first and second channels, selectively switches one of the signals and outputs the signal to the amplifier in the second channel. The same is true for the subsequent channels. That is, the first selector in the kth channel receives the digital signals of the kth to (1+2k)th channels, selectively switches one of the signals and outputs the signal to the kth D/A converter in the kth channel. The second selector in the kth channel receives the analog signals from the 0kth redundant D/A converter and the first to kth D/A converters in the first to kth channels, selectively switches one of the signals and outputs the selected signal to the amplifier in the kth channel.

In this configuration, repair is achieved even in the event of malfunction of a number of D/A converters by sequentially switching the signal paths toward the redundant D/A converter by means of the first and second selectors. However, the more the number of redundant D/A converters increases, the more complicated the wirings become, and the larger the circuit area becomes. Therefore, the optimal number of redundant D/A converters may be selected as appropriate in consideration of tradeoffs between the failure rate and cost for the redundant D/A converters.

Third Embodiment

Figure 8:
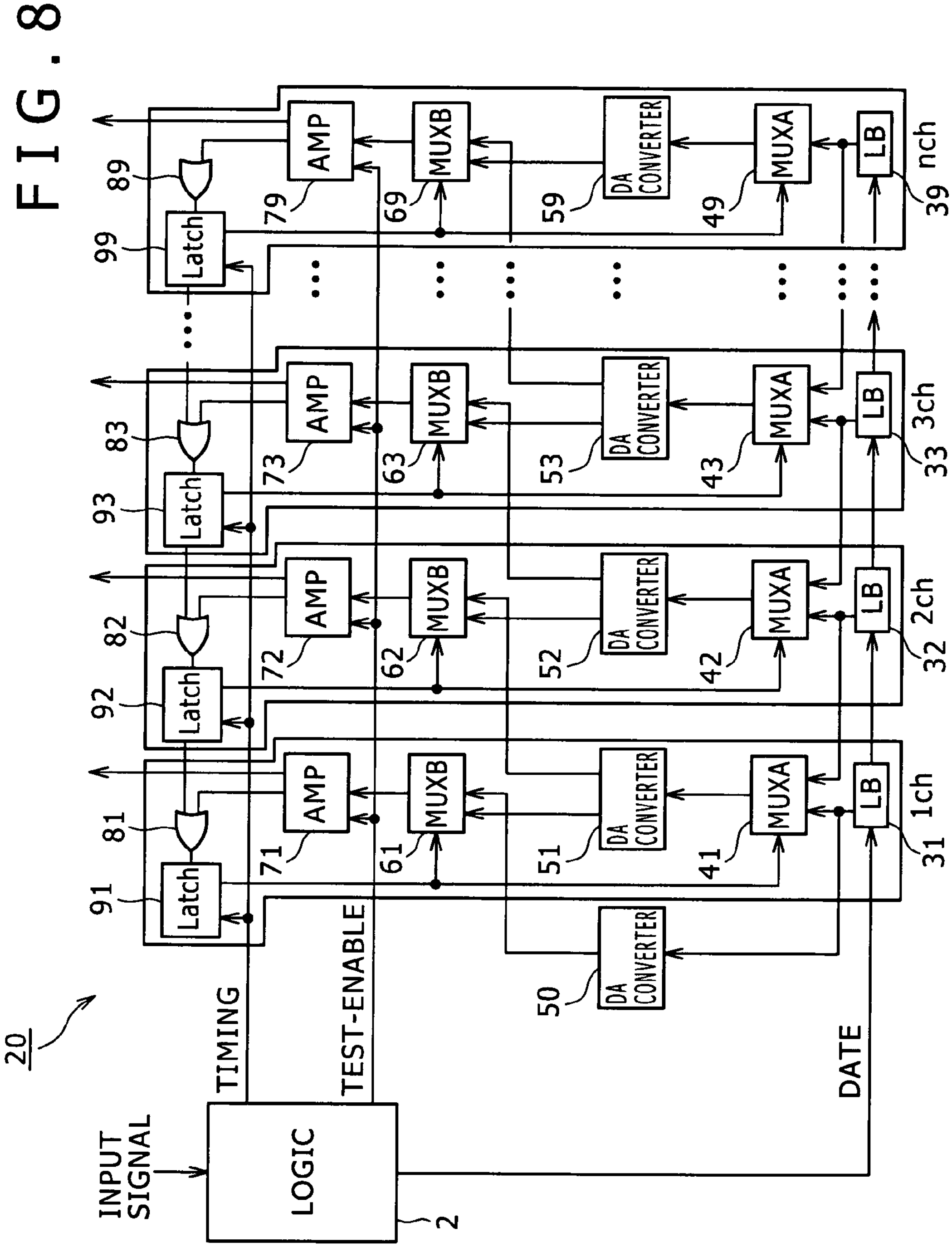
FIG. 8 is a diagram illustrating the configuration of the semiconductor integrated circuit according to still another embodiment of the present invention.

FIG. 8 is a diagram illustrating the configuration of a semiconductor integrated circuit 20 according to a third embodiment of the present invention. In the present embodiment, the amplifiers are capable of serving as malfunction detectors for the D/A converters. The wirings are automatically shifted toward the redundant D/A converter in the event of detection of a malfunctioning sub-D/A converter.

The semiconductor integrated circuit 20 illustrated in FIG. 8 includes the line buffers 31 to 39, first selectors 41 to 49, D/A converters 51 to 59, second selectors 61 to 69, amplifiers 71 to 79 and redundant D/A converter 50. These components and wirings are the same as in the first embodiment shown in FIG. 2 and operate in the same manner.

In addition to the line buffer 31, first and second selectors 41 and 61, D/A converter 51 and amplifier 71, the first channel includes a logic circuit 81 adapted to take the logical sum of two signals, a malfunction determination signal from the amplifier 71 and a malfunction detection signal generated by the second channel that is lower in order. The first channel further includes a latch circuit 91 adapted to receive the logical sum signal from the logic circuit 81 and output a switching signal to the first and second selectors 41 and 61. On the other hand, each of latch circuits 92 to 99 in the channels lower in order than the first channel supplies a logical sum signal to the channel higher in order by one.

Each of the amplifiers 71 to 79 in each of the channels inspects the D/A converter in the own channel in response to a test-enable signal from the logic circuit 2 to determine whether the D/A converter malfunctions. Each of the amplifiers 71 to 79 generates a malfunction determination signal to the logic circuit in the own channel if the D/A converter is determined to malfunction. On the other hand, each of the latch circuits 91 to 99 in each of the channels is reset upon receipt of a timing signal from the logic circuit 2.

The amplifiers 71 to 79 can each include an operational amplifier and selector. In normal operation, for example, the operational amplifier has its output terminal connected to its inverted input terminal so as to function as a non-inverted amplifier. In inspection mode, the operational amplifier has its inverted input terminal connected to the reference voltage and its non-inverted input terminal to the output terminal of the second selector in the own channel so as to function as a comparator. Further, the amplifiers 71 to 79 can each include a plurality of operational amplifiers. For example, the same amplifiers 71 to 79 can each be configured, for example, to compare two analog signals, one each from the D/A converters adjacent to each other, thus detecting a malfunctioning D/A converter.

The semiconductor integrated circuit 20 illustrated in FIG. 8 operates in the following manner. That is, when in inspection mode, the logic circuit 2 outputs a timing signal to the latch circuits 91 to 99 to reset these circuits. Further, the logic circuit 2 outputs a test-enable signal to the amplifiers 71 to 79 to switch each of these amplifiers to the inspection mode connection. Accordingly, each of the amplifiers 71 to 79 function as a malfunction detector adapted to detect the malfunction of the D/A converter in the own channel.

For example, if the amplifier 73 in the third channel detects the malfunction of the D/A converter 53, the same amplifier 73 outputs a high-level logical sum signal to a logic circuit 83 that includes an OR circuit. Because the other D/A converters 51, 52, and 54 to 59 function properly, the amplifiers 71, 72, and 74 to 79 output a low-level signal respectively to the logic circuits 81, 82, and 84 to 89 in their own channels.

The logic circuit 83 in the third channel receives a high-level malfunction determination signal and outputs a high-level logical sum signal to the latch circuit 93. The latch circuit 93 outputs a high-level malfunction detection signal to the logic circuit 82 in the second channel. The logic circuit 82 outputs a high-level logical sum signal to the latch circuit 92. The latch circuit 92 outputs a high-level malfunction detection signal to the logic circuit 81 in the first channel. The logic circuit 81 outputs a high-level logical sum signal to the latch circuit 91. On the other hand, the logic circuit 83 in the third channel receives a low-level signal, for example, from the latch circuit 99 in the channel lower in order than the own channel.

The latch circuits 91 to 93 that have received a high-level signal from the logic circuits in the own channels output a switching signal respectively to the first selectors 41 to 43 and second selectors 61 to 63. Each of the first selectors 41 to 43 receives the digital signal of the channel lower in order by one than the own channel and outputs the signal to the D/A converter in the own channel. Each of the second selectors 61 to 63 receives the analog signal from the D/A converter in the channel higher in order than the own channel and outputs the signal to the amplifier in the own channel. That is, each of the digital signals of the third channel and the channels higher in order than the third channel is converted into an analog signal by the D/A converter higher in order by one. The analog signal is output to the channel lower in order.

No switching signal is generated by the latch circuit 99 in the channel lower in order than the third channel. Therefore, the digital signal of the own channel is converted into an analog signal by the D/A converter in the own channel. The analog signal is amplified by the amplifier in the own channel, and the amplified signal is output to external equipment.

As described above, if one of the D/A converters malfunctions, the semiconductor integrated circuit 20 illustrated in FIG. 8 shifts the signal paths toward the redundant D/A converter so as to avoid the malfunctioning D/A converter for normal operation. Further, when the malfunction detection mechanism and the automatic switching mechanism for the first and second selectors described above are applied to the semiconductor integrated circuit 10 according to the second embodiment, the same circuit 10 can be automatically repaired even in the event of malfunction of two D/A converters.

Fourth Embodiment

Figure 9:
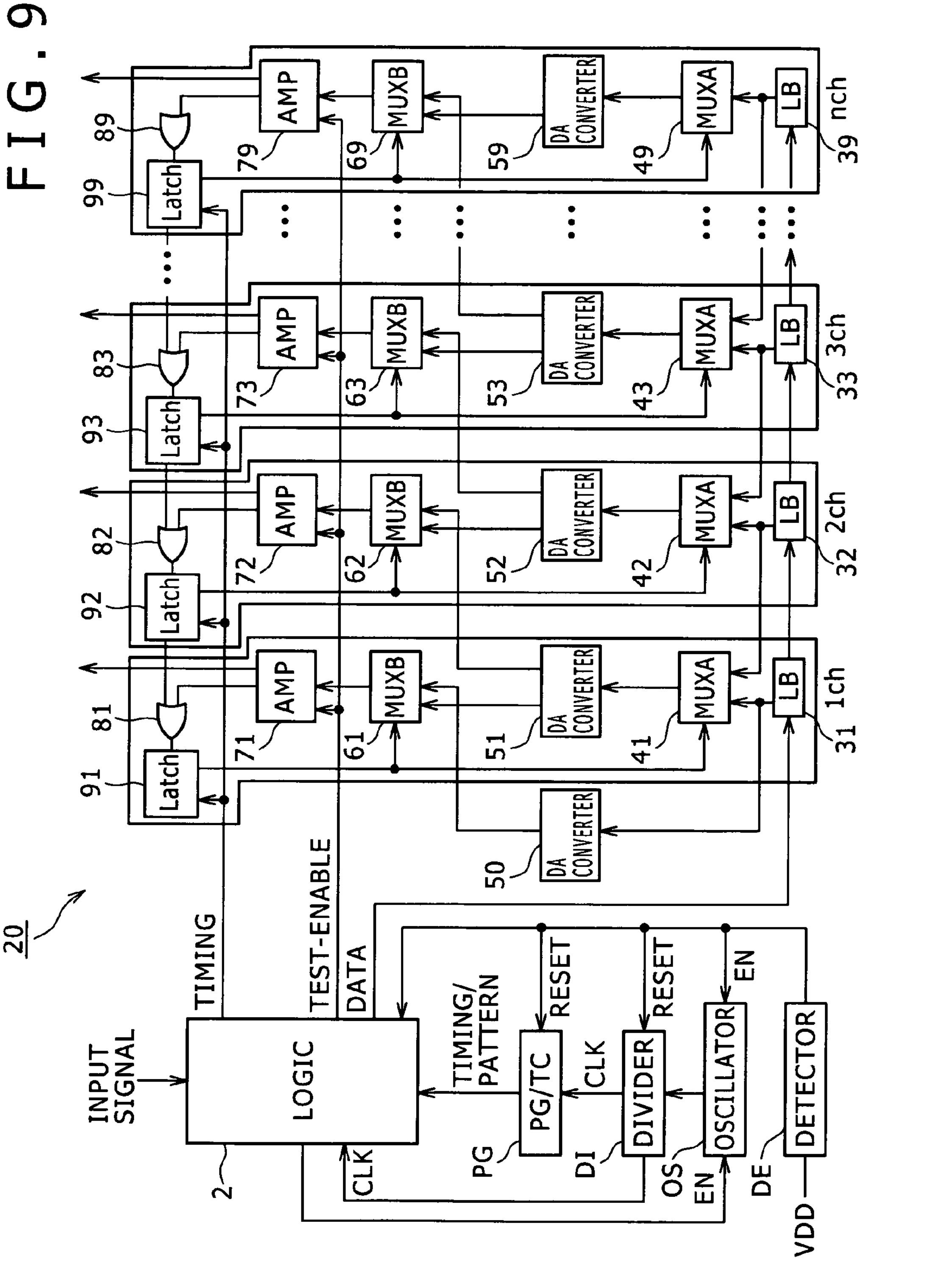
FIG. 9 is a diagram illustrating the configuration of the semiconductor integrated circuit according to still another embodiment of the present invention.

FIG. 9 is a diagram illustrating the configuration of the semiconductor integrated circuit 20 according to a fourth embodiment of the present invention. In the fourth embodiment, a pattern/timing generator adapted to generate patterns is added to the semiconductor integrated circuit according to third embodiment. The pattern/timing generator generates test pattern data and test timing signals for detection of a malfunctioning D/A converter in inspection mode.

In FIG. 9, the logic circuit 2, line buffers 31 to 39, first selectors 41 to 49, D/A converters 51 to 59, redundant D/A converter 50, second selectors 61 to 69, amplifiers 71 to 79, logic circuits 81 to 89 and latch circuits 91 to 99 are configured in the same manner as in the third embodiment illustrated in FIG. 8. Therefore, the description thereof is omitted. Like components and components having like functions are denoted by like reference numerals.

A detector circuit DE receives a VDD voltage and generates an enable signal and reset signal. An oscillator circuit OS receives the enable signal and begins oscillation according to the polarity of the enable signal to generate an oscillation signal. A divider circuit DI receives the oscillation signal and divides the frequency of the oscillation signal to generate a clock signal CLK. A pattern/timing circuit PG is a pattern/timing generator circuit adapted to receive the clock signal CLK and generate a test pattern signal and test operation timing signal.

The above semiconductor integrated circuit operates in the following manner. That is, the detector circuit DE generates an enable signal and reset signal by detecting the rise of the voltage VDD to its normal level after the power-on. The oscillator circuit OS receives the enable signal from the detector circuit DE and begins oscillation. The divider circuit DI, pattern/timing circuit PG and logic circuit 2 are reset upon reception of the reset signal from the detector circuit DE. The oscillator OS that has begun oscillation outputs an oscillation signal to the divider circuit DI. The same circuit DI receives the oscillation signal and divides the frequency of the oscillation signal to generate the clock signal CLK and output the same signal CLK to the logic circuit 2 and pattern/timing circuit PG.

The pattern/timing circuit PG generates a test pattern signal and test timing signal using the clock signal CLK and outputs the two signals to the logic circuit 2. The logic circuit 2 generates a test-enable signal and outputs the signal to the amplifiers 71 to 79. The logic circuit 2 further generates a timing signal and outputs the signal to the latch circuits 91 to 99 to reset these circuits. The logic circuit 2 still further generates test pattern data and outputs the data to the line buffers 31 to 39. Each of the amplifiers 71 to 79 functions as a malfunction detector adapted to detect the malfunction of the D/A converters 51 to 59 as a result of reception of the test-enable signal. At the completion of the test, the enable signal is changed from a high to low level, thus stopping the oscillation of the oscillator circuit OS. This terminates the inspection mode.

This configuration makes it possible to detect the malfunction of the D/A converters 51 to 59 without any control signal or test pattern signal supplied from external equipment. Further, the semiconductor integrated circuit can be automatically repaired in the event of malfunction of one of the D/A converters.

It should be noted that, in the above circuit configuration, the detector circuit DE adapted to detect the voltage VDD was provided to activate the inspection mode when the power was turned on. However, the detector circuit DE may be omitted so that the inspection mode is activated by supplying a test control signal from external equipment.

Fifth Embodiment

Figure 10:
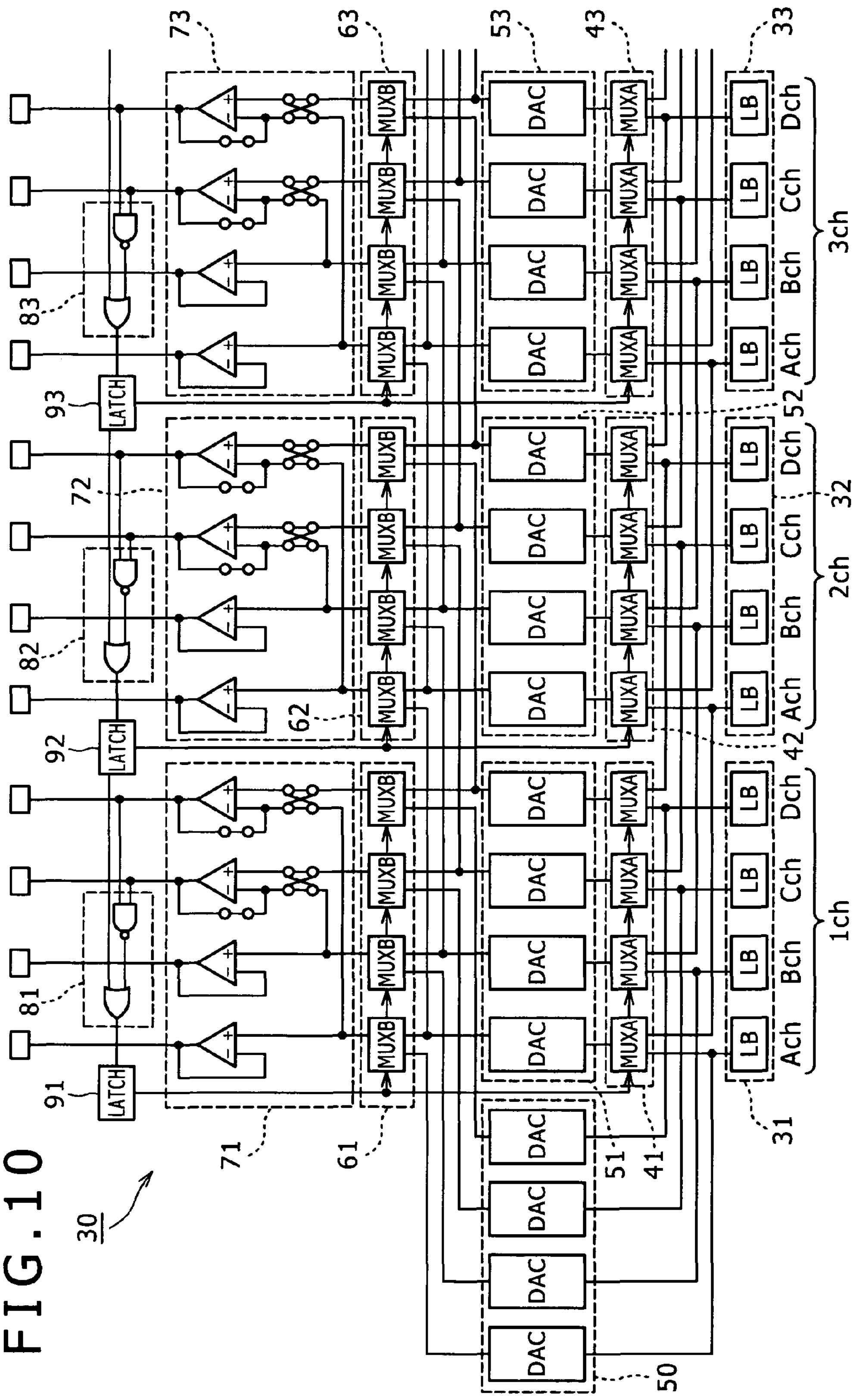
FIG. 10 is a diagram illustrating the configuration of the semiconductor integrated circuit according to still another embodiment of the present invention.

FIG. 10 is a diagram illustrating the configuration of a semiconductor integrated circuit 30 according to a fifth embodiment of the present invention. In the fifth embodiment, each of the channels includes four sub-channels. Like components and components having like functions are denoted by like reference numerals.

As illustrated in FIG. 10, each of the channels includes four sub-channels Ach to Dch. Each of the channels includes four sub-line buffers, four sub-first selectors, four sub-D/A converters, four sub-second selectors, four sub-amplifiers, one logic circuit and one latch circuit that are associated with the four sub-channels. Each of the sub-channels of each of the channels includes a sub-line buffer, sub-first selector, sub-D/A converter, sub-second selector and sub-amplifier. The redundant D/A converter 50 includes four sub-D/A converters. Each of the sub-D/A converters receives a digital signal from the associated sub-line buffer in one of the four sub-channels of the first channel.

A description will be given below with focus, for example, on a sub-channel Ach of the first channel. The sub-first selector receives two digital signals, one from the sub-line buffer in the own sub-channel and another from the sub-channel Ach of the second channel, selectively switches one of the signals and outputs the selected signal to the sub-D/A converter in the own sub-channel. The sub-D/A converter in the sub-channel Ach converts the digital signal into an analog signal. The sub-second selector in the sub-channel Ach receives two analog signals, one from the redundant sub-D/A converter adapted to convert the digital signal of the own sub-channel Ach into an analog signal, and another from the sub-D/A converter in the own sub-channel Ach, selectively switches one of the signals and outputs the selected signal to the sub-amplifier in the own sub-channel Ach. Other sub-channels are configured in the same manner.

The components in the channels lower in order than the second channel operate in the following manner. That is, each of the sub-second selectors in each of the sub-channels switches one of two analog signals, one from the sub-D/A converter in the associated sub-channel of the channel higher in order by one than the own channel and another from the sub-D/A converter in the own sub-channel, and outputs the selected signal to the sub-amplifier in the own sub-channel. It should be noted that although the semiconductor integrated circuit 30 shown in FIG. 10 includes three channels for convenience of description, a practical semiconductor integrated circuit includes many more channels.

Figures 11A, 11B, 11C, 11D:
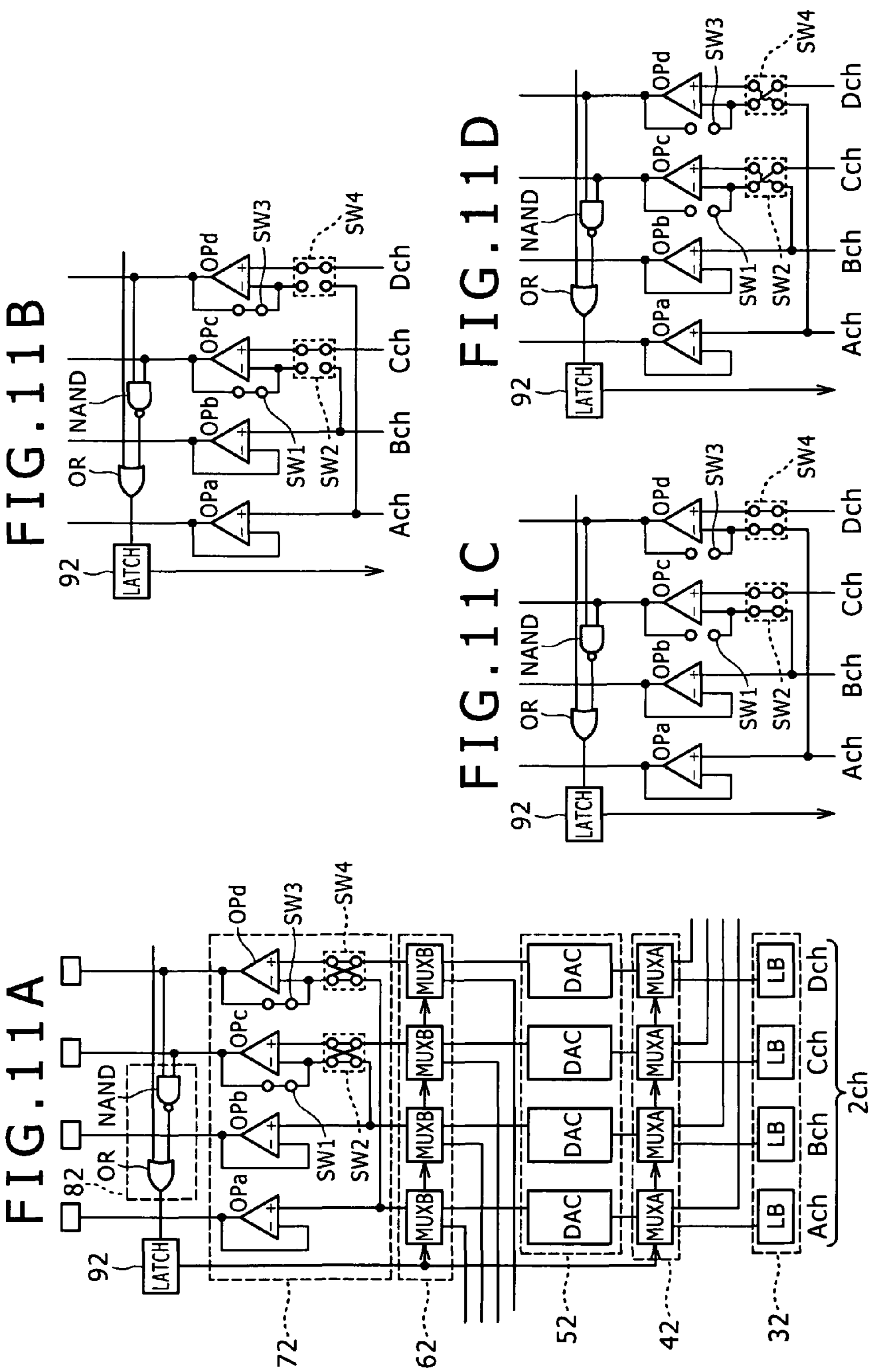
FIGS. 11A to 11D are diagrams illustrating the configuration of a second channel of the semiconductor integrated circuit according to the embodiment of the present invention.

FIG. 11A is a diagram showing the configuration of the second channel. FIG. 11B illustrates the connections of switches SW1 to SW4 provided in the amplifier 72 in normal mode which is used in normal operation. FIG. 11C illustrates the connections of the switches SW1 to SW4 in inspection mode 1 adapted to inspect the D/A converter 52. FIG. 11D illustrates the connections of the switches SW1 to SW4 in inspection mode 2 adapted to inspect the D/A converter 52. It should be noted that the switches SW1 and SW3 correspond to the third selector, and the switches SW2 and SW4 to the fourth selector.

As illustrated in FIG. 11A, sub-channels Ach to Dch include operational amplifiers OPa to OPd as sub-amplifiers. Each of the operational amplifiers OPa and OPb respectively in the sub-channels Ach and Bch is a non-inverted amplifier, having its output terminal connected to its inverted input terminal with the analog signal fed to its non-inverted input terminal from the sub-second selector. The operational amplifier OPc in the sub-channel Cch has the switch SW1 inserted between its output and inverted input terminals. The same amplifier OPc has the switch SW2 inserted between its inverted and non-inverted input terminals and the outputs of the sub-second selectors in the sub-channels Bch and Cch.

The operational amplifier OPd in the sub-channel Dch has the switch SW3 inserted between its output and inverted input terminals. The same amplifier OPd has the switch SW4 inserted between its inverted and non-inverted input terminals and the outputs of the sub-second selectors in the sub-channels Ach and Dch.

The logic circuit 82 includes a NAND circuit and OR circuit. The NAND circuit outputs a negative logical product of the outputs of the operational amplifiers OPc and OPd to the OR circuit. The OR circuit outputs a logical sum of the negative logical product from the NAND circuit and a malfunction detection signal from the third channel lower in order to the latch circuit 92. A concrete description of the operation of the amplifier 72 and the malfunction detection method of the D/A converters will be given below with reference to FIGS. 11B and 11C.

FIG. 11B illustrates the connections of the switches SW1 to SW4 in normal mode. Each of the switches SW1 and SW3 is in a connected state. Each of the operational amplifiers OPc and OPd has its output terminal connected to its inverted input terminal, operating as a non-inverted amplifier. On the other hand, the switches SW2 and SW4 change their connection so as to feed the analog signals converted by the D/A converters in the sub-channels Cch and Dch to the non-inverted input terminals of the operational amplifiers OPc and OPd, respectively. As a result, the same amplifiers OPc and OPd function as current amplifiers equivalent to the operational amplifiers OPa and OPb.

When in inspection mode, the logic circuit 2 outputs a test-enable-signal to the amplifier 72, thus setting the switches SW1 to SW4. At the same time, the same circuit 2 resets the latch circuit 92 by means of a timing signal and outputs test data to the line buffer 32.

FIG. 11C illustrates the connections of the switches SW1 to SW4 in inspection mode 1, i.e., first inspection mode. The switch SW1 changes to an open position. The switch SW2 changes its connection so as to feed the output of the sub-second selector in the sub-channel Bch to the inverted input terminal of the operational amplifier OPc, and the output of the sub-second selector in the own sub-channel to the non-inverted input terminal of the same amplifier OPc. Therefore, the operational amplifier OPc operates as a comparator adapted to compare the output voltages of the two sub-D/A converters in the sub-channels Bch and Cch. Further, the switch SW3 changes to an open position. The switch SW4 changes its connection so as to feed the output of the sub-second selector in the sub-channel Ach to the inverted input terminal of the operational amplifier OPd, and the output of the sub-second selector in the own sub-channel Dch to the non-inverted input terminal of the same amplifier OPd. Therefore, the operational amplifier OPd operates as a comparator adapted to compare the output voltages of the two sub-D/A converters in the sub-channels Ach and Dch.

The logic circuit 2 outputs test data to the line buffer 32 and sets voltages Va, Vb, Vc and Vd respectively in the sub-channels Ach, Bch, Cch and Dch. In this case, the voltage Vc is set higher than the voltage Vb by an extremely small voltage δcb, and the voltage Vd is set higher than the voltage Va by an extremely small voltage δda. The voltages Va, Vb, Vc and Vd are varied while maintaining the above two relationships. When all the sub-D/A converters function properly, the relationships Vc>Vb and Vd>Va are maintained between the voltages converted by the sub-D/A converters. Therefore, a high-level signal is output from the operational amplifiers OPc and OPd, and a low level is output from the NAND circuit, indicating that none of the D/A converters malfunctions. On the other hand, if the relationship is Vc<Vb or Vd<Va between the voltages converted by the sub-D/A converters, a low level is output from one or both of the operational amplifiers OPc and OPd. As a result, the output of the NAND circuit changes to a high level. This changes the output of the OR circuit to a high level, notifying that one of the D/A converters malfunctions.

However, the sub-D/A converter in the sub-channel Bch may become defective, generating a voltage lower than the set voltage Vb. Further, the sub-D/A converter in the sub-channel Ach may become defective, generating a voltage lower than the set voltage Va. In these cases, the relationships Vc>Vb and Vd>Va are maintained between the voltages converted by the sub-D/A converters. As a result, malfunction of a sub-D/A converter may not be detected in some cases.

For this reason, the switches SW2 and SW4 change their connection as illustrated in FIG. 11D in the next mode or inspection mode 2. That is, the voltage Vc of the sub-channel Cch is fed to the inverted input terminal of the operational amplifier OPc, and the voltage Vb of the sub-channel Bch to the non-inverted input terminal of the same amplifier OPc. Further, the voltage Vd of the sub-channel Dch is fed to the inverted input terminal of the operational amplifier OPd, and the voltage Va of the sub-channel Ach to the non-inverted input terminal of the same amplifier OPd.

Further, the logic circuit 2 sets the voltage Vb higher than the voltage Vc by an extremely small voltage δbc, and the voltage Va higher than the voltage Vd by an extremely small voltage bad. The same circuit 2 varies the voltages Va, Vb, Vc and Vd while maintaining these relationships. When all the sub-D/A converters function properly, the relationships Vb>Vc and Va>Vd are maintained between the voltages converted by the sub-D/A converters. Therefore, a high-level signal is output from the operational amplifiers OPc and OPd, and a low level is output from the NAND circuit, indicating that none of the D/A converters malfunctions.

On the other hand, if the relationship is Vb<Vc or Va<Vd between the voltages converted by the sub-D/A converters, a low level is output from one or both of the operational amplifiers OPc and OPd. As a result, the output of the NAND circuit changes to a high level. This changes the output of the OR circuit to a high level, notifying that one of the D/A converters malfunctions.

If the malfunction of a D/A converter is detected in the above inspection mode 1 or 2, the latch circuit 92 receives a high-level signal from the OR circuit and outputs a switching signal to the first and second selectors 42 and 62. At the same time, the same circuit 92 outputs a malfunction detection signal to the first channel that is higher in order. The logic circuit 81 in the first channel receives the high-level malfunction detection signal from the latch circuit 92, and the OR circuit thereof outputs a high-level logical sum signal. The latch circuit 91 in the first channel receives the high-level logical sum signal and outputs a switching signal to the first and second selectors 41 and 61.

As a result, each of the sub-first selectors in the first channel outputs a digital signal for one of the sub-channels of the second channel to one of the sub-D/A converters in the own sub-channel. Each of the sub-second selectors in the first channel outputs the analog signal, converted by one of the redundant sub-D/A converters, to the sub-amplifier in the own sub-channel. Therefore, the digital signals of the sub-channels of the second channel are converted by the D/A converter 51 in the first channel. The signals from the D/A converter 51 are output to the amplifier 72 (operational amplifiers OPa to OPd) via the second selector 62 of the second channel for amplification. The amplified signals are output to external equipment. On the other hand, the digital signals of the sub-channels of the first channel are converted by the redundant D/A converter 50. The signals from the D/A converter 50 are output to the amplifier 71 (operational amplifiers OPa to OPd) via the second selector 61 of the first channel for amplification. The amplified signals are output to external equipment.

As described above, when each of the amplifiers includes an operational amplifier OP so that the amplifier functions as a current amplifier in normal operation and as a comparator in inspection modes, it is possible to detect the malfunction of D/A converters with a relatively simple configuration and achieve redundancy repair with a redundant circuit.

It should be noted that the semiconductor integrated circuit 30 according to the fifth embodiment is preferably applicable to a signal drive circuit of a liquid crystal panel. In a liquid crystal panel, a positive-negative alternating voltage is applied to the liquid crystal layer with respect to a common electrode to prevent deterioration of the liquid crystal and reliability degradation. For example, a positive (or negative) voltage is applied to the sub-channels Ach and Dch, and a negative (or positive) voltage to the sub-channels Bch and Cch. Then, the outputs of the sub-channels Ach and Bch are caused to alternate, and the outputs of the sub-channels Cch and Dch are also caused to alternate, thus applying an alternating voltage to the liquid crystal panel.

It should be noted that, in the fifth embodiment, four sub-channels are treated as one channel and that, if one of the D/A converters in the sub-channels malfunctions, the connections are shifted toward the redundant D/A converter on a channel-by-channel basis for redundancy repair. In this case, each sub-channel may be considered an independent channel. That is, each of the first selectors selectively switches either of the digital signals, one of the own channel and another of the channel lower in order by four than the own channel, and outputs the selected signal to the D/A converter in the own channel. On the other hand, each of the second selectors selectively switches either of the two analog signals, one converted by the D/A converter in the own channel and another converted by the D/A converter in the channel lower in order by four than the own channel, and outputs the selected signal to the amplifier in the own channel.

Figure 12:
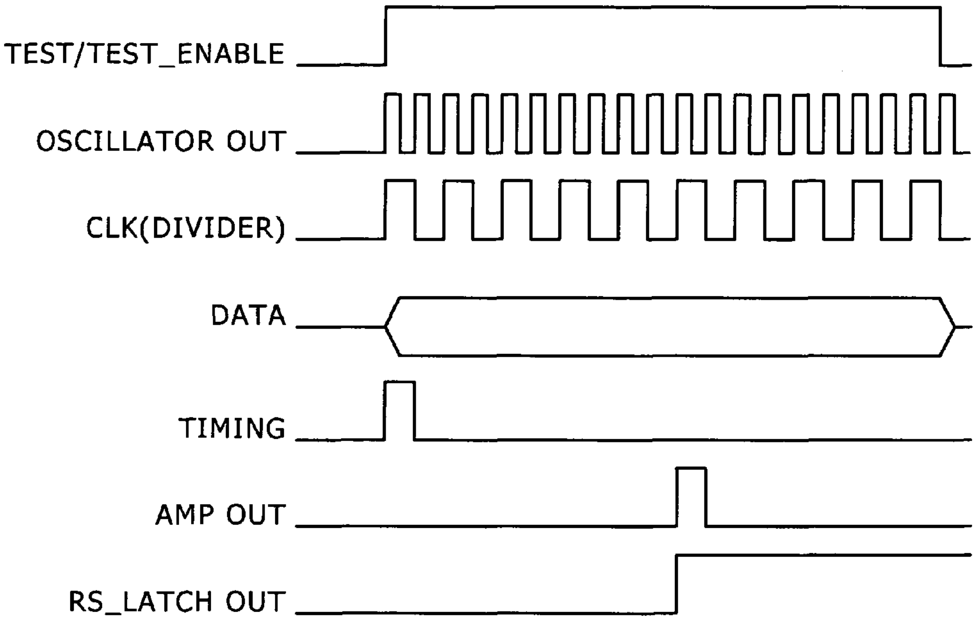
FIG. 12 is a timing diagram of the semiconductor integrated circuit according to the embodiments of the present invention.

FIG. 12 is a timing diagram of the semiconductor integrated circuit according, for example, to the fourth embodiment shown in FIG. 9 or to the fifth embodiment shown in FIG. 10 in inspection mode. When the voltage VDD is applied after the power-on, the detector circuit DE outputs an enable signal and reset signal, and the oscillator circuit OS outputs an Oscillator OUT signal. The divider circuit DI outputs the clock signal CLK. The logic circuit 2 changes a TEST/Test_Enable signal from a low to high level to initiate the inspection mode. The TEST/Test_Enable signal is supplied to the amplifiers 71 to 79 and latch circuits 91 to 99. At the same time, the logic circuit 2 supplies a Data signal to the line buffers 31 to 39. The Data signal includes test data. In inspection mode, the amplifiers 71 to 79 function as malfunction detectors of the D/A converters 51 to 59. In the event of malfunction, an AMP out signal of the amplifier in question changes from a low to high level. This changes the output of the logic circuit from a low to high level, changing an RS_Latch OUT signal of the latch circuit from a low to high level. The RS_Latch OUT signal is output to the first and second selectors in the channel in question and the channels higher in order than the channel in question.

Sixth Embodiment

Figure 13:
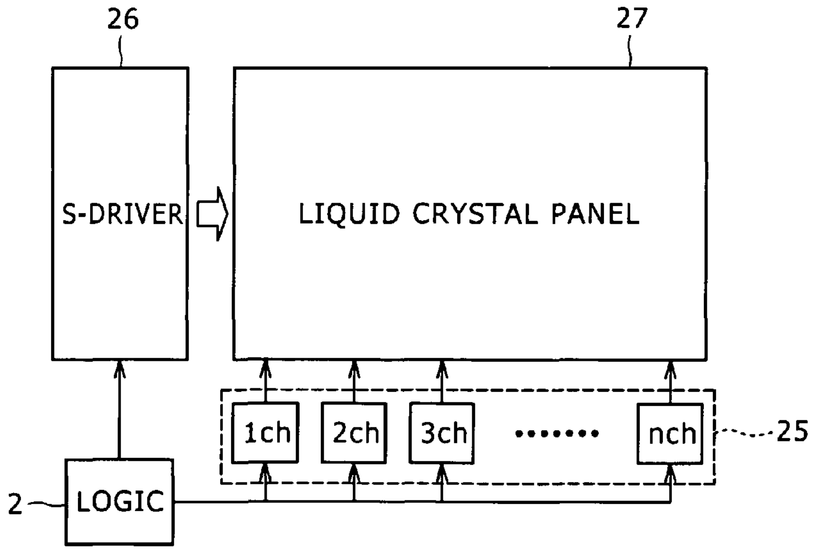
FIG. 13 is a diagram illustrating the configuration of a liquid crystal drive circuit according to still another embodiment of the present invention.
Figure 14:
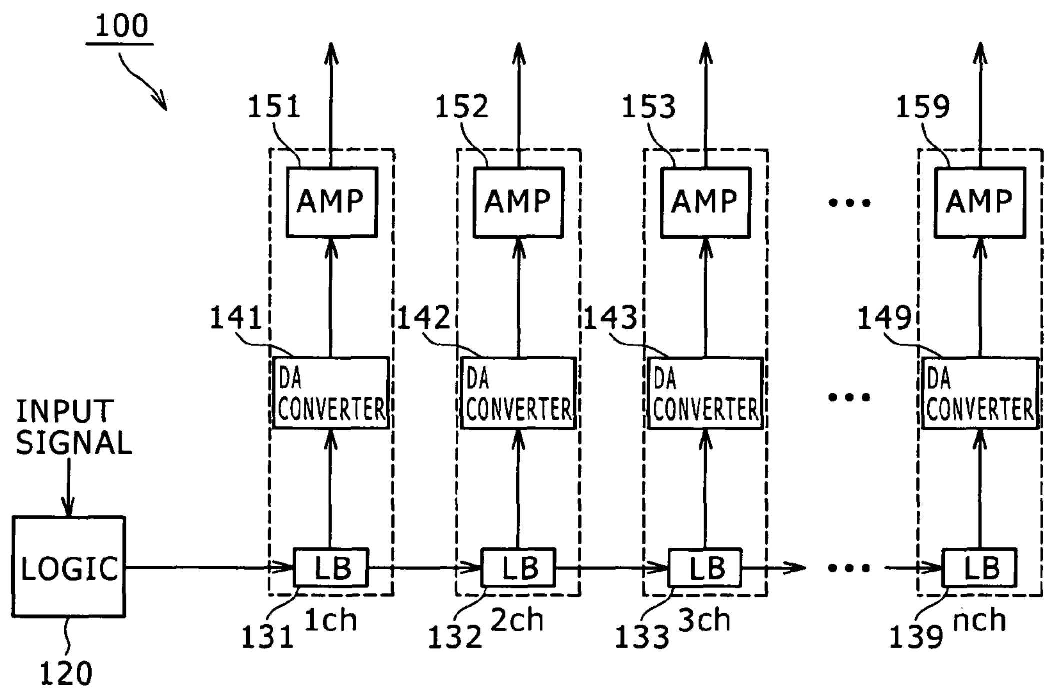
FIG. 14 is a diagram illustrating the configuration of a semiconductor integrated circuit that is already well known.

FIG. 13 is a schematic diagram illustrating a liquid crystal drive circuit according to a sixth embodiment of the present invention. The liquid crystal drive circuit includes a scan line driver 26, signal line driver 25, the logic circuit 2 and other circuitry. The scan line driver 26 drives the scan lines of a liquid crystal panel 27. The signal line driver 25 drives the signal lines. The logic circuit 2 supplies drive signals to these drivers. The signal line driver 25 includes the semiconductor integrated circuit described in the first to fifth embodiments. The analog signals output from the first to nth channels of the semiconductor integrated circuit are supplied to the signal lines of the liquid crystal panel 27.

In particular, the liquid crystal panel 27 has 500 or more signal lines formed therein. A faulty image signal supplied to one of the signal lines becomes visible as a line defect. The present liquid crystal drive circuit can perform redundancy repair even in the event of malfunction of a D/A converter, contributing to significant cost reduction for liquid crystal drive circuits.

The present application contains subject matter related to that disclosed in Japanese Priority Patent Application JP 2009-158067 filed in the Japan Patent Office on Jul. 2, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:

line buffers respectively configured to convert serial data into alpha and beta channel parallel digital signals;

an alpha channel first selector configured to selectively switch one of the alpha and beta channel digital signals and output the selected signal;

an alpha channel digital-to-analog converter configured to convert the digital signal fed from the alpha channel first selector into an analog signal;

a beta channel digital-to-analog converter configured to convert the beta channel digital signal into an analog signal;

a redundant digital-to-analog converter configured to convert the alpha channel digital signal into an analog signal;

an alpha channel second selector configured to selectively switch one of two analog signals, one from the redundant digital to analog converter and another from the alpha channel digital-to-analog converter and output the selected signal;

a beta channel second selector configured to selectively switch one of two analog signals, one from the alpha channel digital-to-analog converter and another from the beta channel digital-to-analog converter and output the selected signal;

an alpha channel amplifier configured to amplify the analog signal fed from the alpha channel second selector; and a beta channel amplifier configured to amplify the analog signal fed from the beta channel second selector, wherein the alpha channel includes first to nth channels with the first channel being higher in order and the nth channel being lower in order where n is an integer equal to or greater than 2, the line buffers are respectively configured to generate digital signals of corresponding ones of the first to nth channels, each of the first to nth channels includes a first selector, digital-to-analog converter, second selector and amplifier, assuming that the redundant digital-to-analog converter is the highest-order zeroth digital-to-analog converter, the digital-to-analog converters in the first to nth channels are respectively the first to nth digital-to-analog converters with the first digital-to-analog converter being higher in order and the nth digital-to-analog converter being lower in order, and the digital-to-analog converter in the beta channel is the lowest-order digital-to-analog converter, the first selector in each of the first to nth channels selectively switches one of two digital signals, one of the own channel and another of the channel lower in order than the own channel, and outputs the selected signal to the digital-to-analog converter in the own channel, and the second selector in each of the first to nth channels selectively switches one of two analog signals, one from the digital-to-analog converter in the own channel and another from the higher-order digital-to-analog converter, and outputs the selected signal to the amplifier in the own channel.

2. The semiconductor integrated circuit according to claim 1, wherein the first selector in each of the first to nth channels selectively switches one of two digital signals, one of the own channel and another of the channel lower in order by one than the own channel, and outputs the selected signal to the digital-to-analog converter in the own channel, and the second selector in each of the first to nth channels selectively switches one of two analog signals, one from the digital-to-analog converter in the own channel and another from the digital-to-analog converter higher in order by one, and outputs the selected signal to the amplifier in the own channel.

3. The semiconductor integrated circuit according to claim 1, wherein in the presence of channels higher in order than a jth channel where j is an integer equal to or greater than 1 and equal to or smaller than n, the first selector in each of the channels higher in order than the jth channel outputs a digital signal of a lower-order channel to the digital-to-analog converter in the own channel in response to a switching signal, and the first selector in each of the channels lower in order than the jth channel outputs a digital signal of the own channel to the digital-to-analog converter in the own channel, and in the presence of the jth channel and channels higher in order than the jth channel, the second selector in each of the channels higher in order than the jth channel outputs an analog signal, generated by the higher-order digital-to-analog converter, to the amplifier in the own channel in response to the switching signal, and the second selector in each of the channels lower in order than the jth channel outputs an analog signal fed from the digital-to-analog converter in the own channel to the amplifier in the own channel.

4. The semiconductor integrated circuit according to claim 1, wherein the amplifier in each channel functions as a malfunction detector adapted to inspect the digital-to-analog converter in the own channel to determine whether the digital-to-analog converter malfunctions and generate a malfunction determination signal, and each of the channels further includes a logic circuit adapted to take the logical sum of a malfunction determination signal generated by the amplifier in the own channel and a malfunction detection signal generated, in the presence of a channel lower in order than the own channel, by the lower-order channel, and a latch circuit adapted to hold a logical sum signal fed from the logic circuit in the own channel and generate a malfunction detection signal, in the presence of a channel higher in order than the own channel, for the higher-order channel and a switching signal to be supplied to the first and second selectors in the own channel.

5. The semiconductor integrated circuit according to claim 1, wherein each of the channels includes first to xth sub-channels where x is an integer equal to or greater than 2, the first selector in each of the channels includes first to xth sub-first selectors, the digital-to-analog converter in each of the channels includes first to xth sub-digital-to-analog converters, the zeroth digital-to-analog converter includes first to xth sub-digital-to-analog converters, the second selector in each of the channels includes first to xth sub-second selectors, the amplifier in each of the channels includes first to xth sub-amplifiers, a pth sub-first selector, where p is an integer between 1 and x, in each of the channels selectively switches one of two digital signals, one of a pth sub-channel of the own channel and another, in the presence of a channel lower in order than the own channel, of a pth sub-channel of the lower-order channel, and outputs the selected signal to a pth sub-digital-to-analog converter in the own channel, a pth sub-second selector in each of the channels selectively switches one of analog signals, one from the pth sub-digital-to-analog converter in the own channel and another, in the presence of a channel higher in order than the own channel, from the pth sub-digital-to-analog converter in the higher-order channel, and outputs the selected signal, and a pth sub-amplifier in each of the channels amplifies an analog signal output from a pth sub-second selector in the own channel.

6. The semiconductor integrated circuit according to claim 5, wherein each of the sub-digital-to-analog converters includes an operational amplifier, and a given sub-channel of the first to nth sub-channels includes third and fourth selectors, the third selector configured to switch the function of the operational amplifier from amplifier to comparator, and the fourth selector configured to switch the input of the operational amplifier from input from the second selector in the own sub-channel to parallel inputs, one from the second selector in the own sub-channel and another from the second selector in other sub-channel.

7. The semiconductor integrated circuit according to claim 1, wherein the first selectors respectively include fuses, and the first selectors are respectively configured to output a signal of the own channel when a corresponding fuse has not been blown, and to output a signal of the channel lower in order than the own channel when the corresponding fuse has been blown.

8. The semiconductor integrated circuit according to claim 1, wherein the second selectors respectively include fuses, and the second selectors are respectively configured to output a signal of the own channel when a corresponding fuse has not been blown, and to output a signal of the channel higher in order than the own channel when the corresponding fuse has been blown.

9. The semiconductor integrated circuit according to claim 1, further comprising a second redundant digital-to-analog converter configured to convert the alpha channel digital signal into an analog signal.

10. The semiconductor integrated circuit according to claim 1, wherein n is an integer equal to or greater than 500.

11. A display device comprising:

a liquid crystal panel;

a scan line driver;

a signal line driver; and a logic circuit, wherein the signal line driver includes the semiconductor integrated circuit according to claim 1.

12. A semiconductor integrated circuit comprising:

a plurality of channels, respective ones of the plurality of channels including a line buffer configured to convert serial input data into one of a plurality of parallel data signals;

a first selector configured to selectively switch between a parallel data signal corresponding to the respective channel and a parallel data signal corresponding to an adjacent channel, and to output the selected parallel data signal;

a digital-to-analog converter configured to convert the output of the first selector into an analog signal;

a second selector configured to selectively switch between an output of a digital-to-analog converter corresponding to the respective channel and a digital-to-analog converter corresponding to an adjacent channel, and to output the selected analog signal; and an amplifier; and a redundant digital-to-analog converter, wherein the plurality of channels includes first to nth channels with the first channel being highest in order and the nth channel being lowest in order, where n is an integer equal to or greater than 3, and for a respective channel, the first selector is configured to switch between the respective channel and an adjacent channel of lower order and the second selector is configured to switch between the respective channel and an adjacent channel of higher order.

13. The semiconductor integrated circuit according to claim 12, wherein in the presence of channels higher in order than a jth channel where j is an integer equal to or greater than 1 and equal to or smaller than n, the first selector in a respective channel higher in order than the jth channel outputs a digital signal of a lower-order channel to the digital-to-analog converter in the respective channel in response to a switching signal, and the first selector a respective channel lower in order than the jth channel outputs a digital signal of the respective channel to the digital-to-analog converter in the respective channel, and in the presence of the jth channel and channels higher in order than the jth channel, the second selector in a respective channel higher in order than the jth channel outputs an analog signal, generated by the higher-order digital-to-analog converter, to the amplifier in the respective channel in response to the switching signal, and the second selector in a respective channel lower in order than the jth channel outputs an analog signal fed from the digital-to-analog converter in the respective channel to the amplifier in the respective channel.

14. The semiconductor integrated circuit according to claim 12, wherein the amplifier in a respective channel functions as a malfunction detector adapted to inspect the digital-to-analog converter in the respective channel to determine whether the digital-to-analog converter malfunctions and generate a malfunction determination signal, and respective ones of the plurality of channels further includes a logic circuit adapted to take the logical sum of a malfunction determination signal generated by the amplifier in the respective channel and a malfunction detection signal generated, in the presence of a channel lower in order than the respective channel, by the lower-order channel, and a latch circuit adapted to hold a logical sum signal fed from the logic circuit in the respective channel and generate a malfunction detection signal, in the presence of a channel higher in order than the respective channel, for the higher-order channel and a switching signal to be supplied to the first and second selectors in the respective channel.

15. The semiconductor integrated circuit according to claim 12, wherein respective ones of the plurality of channels include first to xth sub-channels where x is an integer equal to or greater than 2, the first selector in the respective channel includes first to xth sub-first selectors, the digital-to-analog converter in the respective channel includes first to xth sub-digital-to-analog converters, the zeroth digital-to-analog converter includes first to xth sub-digital-to-analog converters, the second selector in the respective channel includes first to xth sub-second selectors, the amplifier in the respective channel includes first to xth sub-amplifiers, a pth sub-first selector, where p is an integer between 1 and x, in the respective channel selectively switches one of two digital signals, one of a pth sub-channel of the respective channel and another, in the presence of a channel lower in order than the own channel, of a pth sub-channel of the lower-order channel, and outputs the selected signal to a pth sub-digital-to-analog converter in the respective channel, a pth sub-second selector in the respective channel selectively switches one of analog signals, one from the pth sub-digital-to-analog converter in the respective channel and another, in the presence of a channel higher in order than the respective channel, from the pth sub-digital-to-analog converter in the higher-order channel, and outputs the selected signal, and a pth sub-amplifier in the respective channel amplifies an analog signal output from a pth sub-second selector in the respective channel.

16. The semiconductor integrated circuit according to claim 15, wherein respective ones of the sub-digital-to-analog converters include an operational amplifier, and a given sub-channel of the first to nth sub-channels includes third and fourth selectors, the third selector configured to switch the function of the operational amplifier from amplifier to comparator, and the fourth selector configured to switch the input of the operational amplifier from input from the second selector in the respective sub-channel to parallel inputs, one from the second selector in the respective sub-channel and another from the second selector in another sub-channel.

17. The semiconductor integrated circuit according to claim 10, wherein the first selectors respectively include fuses, and the first selectors are respectively configured to output a signal of the respective channel when a corresponding fuse has not been blown, and to output a signal of the channel lower in order than the respective channel when the corresponding fuse has been blown.

18. The semiconductor integrated circuit according to claim 10, wherein the second selectors respectively include fuses, and the second selectors are respectively configured to output a signal of the respective channel when a corresponding fuse has not been blown, and to output a signal of the channel higher in order than the respective channel when the corresponding fuse has been blown.

19. The semiconductor integrated circuit according to claim 10, further comprising a second redundant digital-to-analog converter.

* * * * *